(12) United States Patent
Gu

(10) Patent No.: US 12,190,933 B2
(45) Date of Patent: Jan. 7, 2025

(54) REFRESH ADDRESS GENERATION CIRCUIT

(71) Applicant: CHANGXIN MEMORY TECHNOLOGIES, INC., Hefei (CN)

(72) Inventor: Yinchuan Gu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 176 days.

(21) Appl. No.: 18/153,312

(22) Filed: Jan. 11, 2023

(65) Prior Publication Data

US 2023/0386547 A1 Nov. 30, 2023

Related U.S. Application Data

(63) Continuation of application No. PCT/CN2022/118035, filed on Sep. 9, 2022.

(30) Foreign Application Priority Data

May 30, 2022 (CN) .......................... 202210601980.5

(51) Int. Cl.
*G11C 11/406* (2006.01)
*G11C 11/408* (2006.01)

(52) U.S. Cl.
CPC .. *G11C 11/40603* (2013.01); *G11C 11/40615* (2013.01); *G11C 11/408* (2013.01)

(58) Field of Classification Search
CPC ........ G11C 11/40603; G11C 11/40615; G11C 11/408
See application file for complete search history.

(56) References Cited

U.S. PATENT DOCUMENTS

2010/0110817 A1* 5/2010 Noda .................. G11C 8/18
365/236
2012/0195149 A1 8/2012 Tamlyn
(Continued)

FOREIGN PATENT DOCUMENTS

| CN | 103426462 A | 12/2013 |
| CN | 103578526 A | 2/2014 |

(Continued)

OTHER PUBLICATIONS

Extended European search report in U.S. Appl. No. 22/940,943, mailed on Aug. 30, 2024.

*Primary Examiner* — Min Huang
(74) *Attorney, Agent, or Firm* — Syncoda LLC; Feng Ma

(57) ABSTRACT

A refresh address generation circuit includes: a refresh control circuit and an address generator. The refresh control circuit receives multiple first refresh commands in sequence and performs multiple first refresh operations accordingly, outputs a first clock signal when the number of first refresh operations is less than m, and outputs a second clock signal when the number of first refresh operation is equal to m. The address generator is coupled to the refresh control circuit, and configured to prestore a first address and receive the first clock signal or the second clock signal, and during each first refresh operation, output an address to be refreshed in response to the first clock signal and change the first address in response to the second clock signal. The address to be refreshed includes a first address and a second address with the lowest bit opposite to that of the first address.

20 Claims, 31 Drawing Sheets

(56) References Cited

U.S. PATENT DOCUMENTS

| | | |
|---|---|---|
| 2013/0308394 A1 | 11/2013 | Kim |
| 2014/0029367 A1 | 1/2014 | Jung |
| 2015/0049566 A1* | 2/2015 | Lee .................. G11C 11/40622 |
| | | 365/222 |
| 2016/0005456 A1 | 1/2016 | Ko |
| 2016/0055896 A1* | 2/2016 | Lim .................. G11C 11/40615 |
| | | 365/149 |
| 2016/0336061 A1 | 11/2016 | Lim |
| 2020/0090729 A1 | 3/2020 | Son et al. |
| 2020/0194056 A1 | 6/2020 | Sakurai et al. |
| 2020/0327929 A1 | 10/2020 | Hong |
| 2022/0068429 A1 | 3/2022 | Du et al. |
| 2023/0386546 A1* | 11/2023 | Gu ........................ G11C 11/406 |

FOREIGN PATENT DOCUMENTS

| | | |
|---|---|---|
| CN | 105304118 A | 2/2016 |
| CN | 105989870 A | 10/2016 |
| CN | 109698001 A | 4/2019 |
| CN | 110910928 A | 3/2020 |
| CN | 111816230 A | 10/2020 |
| CN | 106205672 B | 12/2020 |
| CN | 114121115 A | 3/2022 |
| CN | 114822633 A | 7/2022 |
| JP | 2011165243 A | 8/2011 |
| JP | 7064633 B1 | 5/2022 |

\* cited by examiner

REFRESH ADDRESS GENERATION CIRCUIT

CROSS-REFERENCE TO RELATED APPLICATIONS

This is a continuation of International Application No. PCT/CN2022/118035 filed on Sep. 9, 2022, which claims priority to Chinese Patent Application No. 202210601980.5 filed on May 30, 2022. The disclosures of the above-referenced applications are hereby incorporated by reference in their entirety.

BACKGROUND

In a memory, the memory is divided into multiple banks, and there are two modes for refreshing memory addresses, i.e., all bank refresh where all banks are refreshed together for the same address, and same bank refresh where different banks in the same bank group are refreshed in sequence for the same address.

In the process of same bank refresh, how to generate and save an address is a problem to be solved.

SUMMARY

The present disclosure relates to, but is not limited to, a refresh address generation circuit.

Embodiments of the present disclosure provide a refresh address generation circuit, which can not only generate an address to be refreshed, but also maintain a prestored first address during a refresh operation, thus not only ensuring that the refresh operations are performed without omission, but also maintaining the integrity of the address.

Technical solutions of the embodiments of the present disclosure are implemented as follows.

The embodiments of the present disclosure provide a refresh address generation circuit, which includes: a refresh control circuit and an address generator.

The refresh control circuit is configured to receive multiple first refresh commands in sequence and perform multiple first refresh operations correspondingly, output a first clock signal when the number of the first refresh operations is less than m, and output a second clock signal when the number of the first refresh operation is equal to m. m is an integer greater than or equal to 1.

The address generator is coupled to the refresh control circuit, and is configured to prestore a first address and receive the first clock signal or the second clock signal, and during each first refresh operation, output an address to be refreshed in response to the first clock signal and change the first address in response to the second clock signal. The address to be refreshed includes a first address and a second address. The lowest bit of the second address is opposite to the lowest bit of the first address.

Therefore, the embodiments of the present disclosure provide a refresh address generation circuit, which includes: a refresh control circuit and an address generator. The refresh control circuit receives multiple first refresh commands in sequence and performs multiple first refresh operations correspondingly, outputs a first clock signal when the number of the first refresh operations is less than m, and outputs a second clock signal when the number of the first refresh operations is equal to m. m is an integer greater than or equal to 1. The address generator is coupled to the refresh control circuit, and is configured to prestore a first address and receive the first clock signal or the second clock signal, and during each first refresh operation, output an address to be refreshed in response to the first clock signal and change the first address in response to the second clock signal. The address to be refreshed includes a first address and a second address. The lowest bit of the second address is opposite to the lowest bit of the first address. Thus, during the first refresh operation, the address generator not only outputs the address to be refreshed including the first address and the second address, but also maintains the first address unchanged in response to the first clock signal; and after the number of first refresh operations is equal to m, the address generator changes the first address in response to the second clock signal. In this way, it is ensured that the refresh operations are performed without omission, and the integrity of the address is maintained.

DETAILED DESCRIPTION

For making the objectives, technical solutions and advantages of the disclosure clearer, the technical solutions of the disclosure will further be elaborated below in combination with the drawings and embodiments in detail. The described embodiments should not be considered as limits to the disclosure. All other embodiments obtained by those of ordinary skill in the art without creative work shall fall within the scope of protection of the disclosure.

In the following description, "some embodiments" involved describes a subset of all possible embodiments, but it is to be understood that "some embodiments" may be a same subset or different subsets of all possible embodiments and may be combined with each other without conflict.

If a similar expression "first/second" used in the disclosure, the following description is added. In the following description, the term "first\second\third" involved is merely used to distinguish similar objects without representing a specific order for the objects. It is to be understood that "first\second\third" may be interchanged to specific sequences or orders if allowed to implement the embodiments of the disclosure described herein in sequences except the illustrated or described ones.

Unless otherwise defined, all technical and scientific terms used herein have the same meaning as those generally understood by those skilled in the art belonging to the present disclosure. The terms used herein are only adopted to describe the embodiments of the disclosure and not intended to limit the disclosure.

A Double Data Rate Synchronous Dynamic Random Access Memory (DDR SDRAM) is often used as the memory of an electronic device. In the DDR4 SDRAM or the previous DDR SDRAM, a refresh operation is performed to all banks together, and all banks are refreshed simultaneously for the same address, that is, all bank refresh. Same bank refresh is newly added to the DDR5 SDRAM. That is, in the same bank refresh mode, different banks in the same bank group cannot be refreshed simultaneously, which brings a problem of how to generate and save an address.

Figure 1:
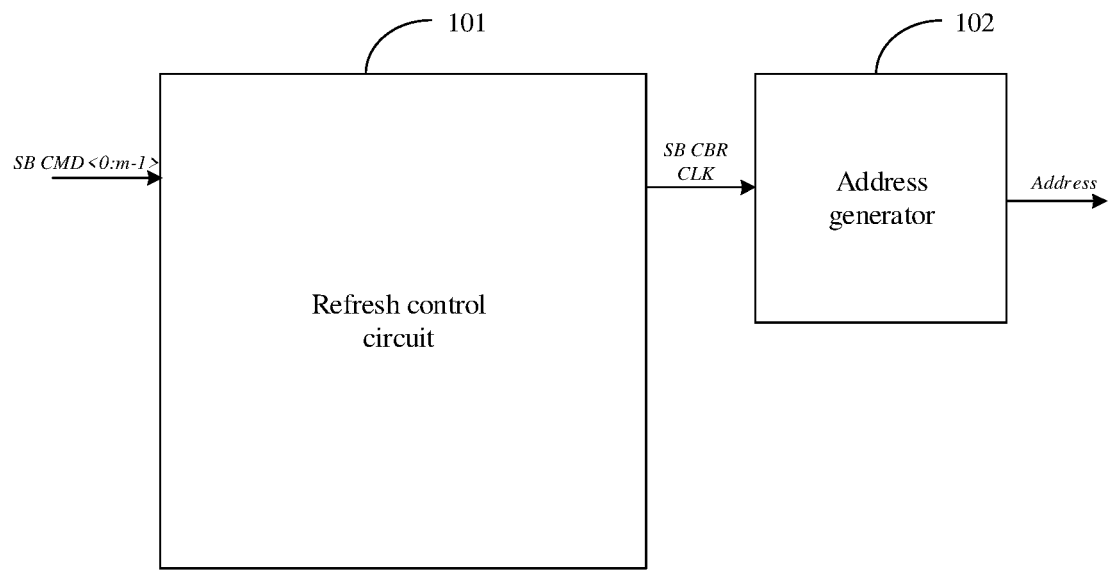
FIG. 1 is schematic structure diagram 1 of a refresh address generation circuit provided by an embodiment of the present disclosure.

FIG. 1 is a schematic structure diagram of a refresh address generation circuit provided by an embodiment of the present disclosure. As shown in FIG. 1, the embodiments of the present disclosure provide a refresh address generation circuit 10, which includes: a refresh control circuit 101 and an address generator 102.

The refresh control circuit 101 is configured to receive multiple first refresh commands SB CMD<0:m−1> in sequence and perform multiple first refresh operations accordingly, output a first clock signal when the number of the first refresh operations is less than m, and output a second clock signal when the number of the first refresh operation is equal to m. m is an integer greater than or equal to 1.

The address generator 102 is coupled to the refresh control circuit, and is configured to prestore a first address and receive the first clock signal or the second clock signal, and during each first refresh operation, output an address to be refreshed Address in response to the first clock signal and change the first address in response to the second clock signal. The address to be refreshed Address includes the first address and a second address. The lowest bit of the second address is opposite to the lowest bit of the first address.

It is to be noted that, in the embodiments of the present disclosure, coupling modes include: direct electrical connection, and electrical connection through other electrical elements (such as a resistor, a delayer or an inverter, etc.). Hereafter, the term "coupled" includes these modes, and will not be repeated.

In the embodiments of the present disclosure, the refresh control circuit 101 may receive multiple first refresh commands SB CMD<0:m−1> in sequence. SB CMD<0:m−1> represents m first refresh commands SB CMD<0> to SB CMD<m−1>. Each first refresh command SB CMD corresponds to a bank in each bank group, and each first refresh command SB CMD will trigger the corresponding bank in each bank group to perform a first refresh operation (i.e., same bank refresh). Correspondingly, multiple first refresh commands SB CMD<0:m−1> received in sequence will trigger the corresponding banks in each bank group to perform a first refresh operation respectively, that is, to perform multiple first refresh operations in sequence.

In the embodiments of the present disclosure, the bank group includes m banks, and the number of banks m is set according to the chip design standard. Each bank includes multiple rows of memory cells, and the address to be refreshed is a row address of the memory cells in the bank. When the refresh control circuit 101 performs the first refresh operation, the address generator 102 outputs the address to be refreshed during the first refresh operation, and the memory cells located at the address to be refreshed in the bank corresponding to the first refresh command SB CMD are refreshed.

In the embodiments of the present disclosure, the refresh control circuit 101 may output a SameBank refresh clock signal SB CBR CLK. The SameBank refresh clock signal SB CBR CLK includes a first clock signal and a second clock signal. If the number of first refresh operations is less than m, it is indicated that there is a bank, in which the first refresh operation has not been performed on the memory cells located at the address to be refreshed, in the bank group, in this case, the refresh control circuit 101 outputs the first clock signal. If the number of first refresh operations is equal to m, it is indicated that in all the banks of the band group, the first refresh operations have been completed for all the memory cells located at the addresses to be refreshed, in this case, the refresh control circuit 101 outputs the second clock signal.

Figure 2:
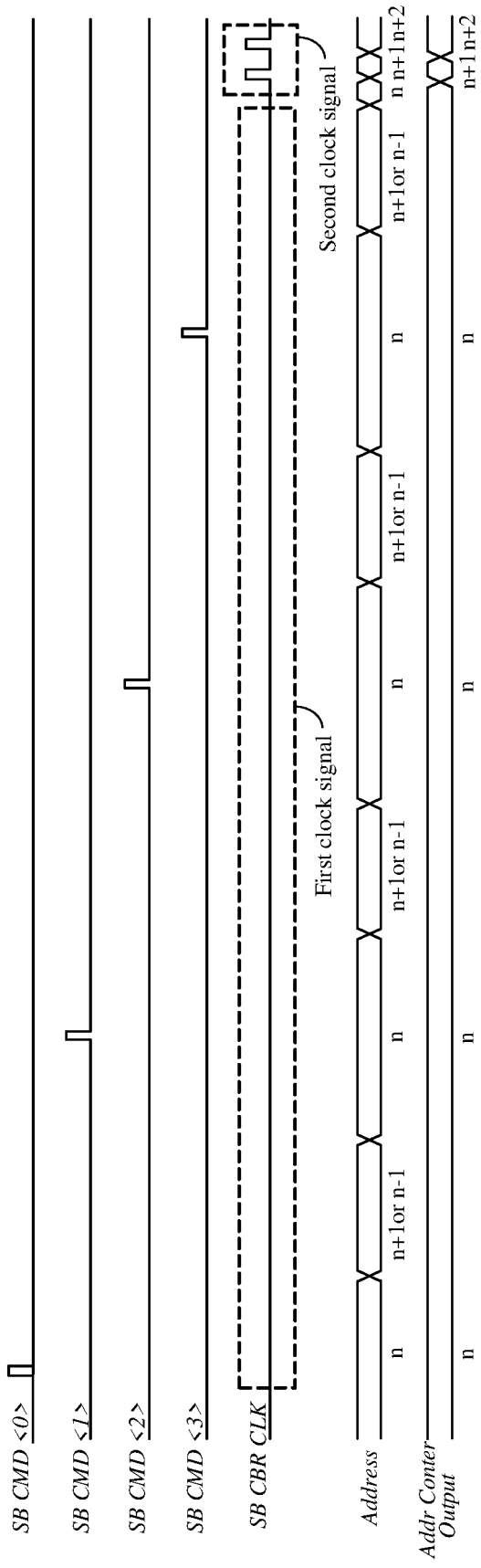
FIG. 2 is schematic signal diagram 1 of a refresh address generation circuit provided by an embodiment of the present disclosure.

As shown in FIG. 2, taking that m is 4 as an example, SB CMD<0>, SB CMD<1>, SB CMD<2>, and SB CMD<3> are the first refresh commands sequentially received by the refresh control circuit, which respectively correspond to four banks in the same bank group, i.e., Bank0, Bank1, Bank2 and Bank3. Correspondingly, pulses in SB CMD<0>, SB CMD<1>, SB CMD<2>, and SB CMD<3> may trigger the refresh control circuit 101 in sequence to perform the first refresh operation. The SameBank refresh clock signal SB CBR CLK includes the first clock signal and the second clock signal. The second clock signal is a pulse, and the first clock signal keeps at a low level.

In the embodiments of the present disclosure, the address generator 102 prestores the first address, and when receiving the first clock signal, outputs the address to be refreshed in response to the first clock signal during each first refresh operation. The address to be refreshed includes the first address and the second address. The lowest bit of the second address is opposite to the lowest bit of the first address. Since the address is binary codes, the second address and the first address with the opposite lowest bits are adjacent addresses. If the first address is n, then the second address is n+1 or n−1; that is, when the lowest bit of the first address n is 0, the lowest bit of n is inverted to 1, then the second address is n+1; when the lowest bit of the first address n is 1, the lowest bit of n is inverted to 0, then the second address is n−1. When receiving the second clock signal, the address generator 102 changes the prestored first address in response to the second clock signal, that is, the changed first address is prestored in the address generator 102 when the first refresh operation is performed next time. The address generator 102 may change the first address in a cumulative mode, and the cumulative value may be controlled by the second clock signal.

As shown in FIG. 2, the addresses to be refreshed include the first address and the second address. The first address is n, and the second address is n+1 or n−1. When the Same-Bank refresh clock signal SB CBR CLK is the first clock signal, the addresses to be refreshed Address output by the address generator 102 are the first address and the second address output one after another. Each group of the first address and second address is output when the first refresh commands SB CMD<0>, SB CMD<1>, SB CMD<2>, and SB CMD<3> trigger the refresh control circuit 101 to perform the first refresh operations. That is, when the first refresh command SB CMD<0> triggers the refresh control circuit 101 to perform the first refresh operation for the first time (i.e., the first first refresh operation), the address generator 102 outputs the addresses to be refreshed Address. The addresses to be refreshed Address include the first address n and the immediately following second address n+1 or n−1, that is, a refresh controller will refresh the corresponding memory cells in Bank0 according to the addresses to be refreshed Address. Similarly, when the second first refresh command SB CMD<1> triggers the refresh control circuit 101 to perform the first refresh operation for the second time (i.e., the second first refresh operation), the address generator 102 outputs the same addresses to be refreshed Address, namely the first address n and the immediately following second address n+1 or n−1, and the refresh controller will refresh the corresponding memory cells in Bank1 according to the addresses to be refreshed Address, and so on until the corresponding memory cells in Bank3 are refreshed. In this way, the memory cells corresponding to the first address n and the second address n+1 or n−1 in all banks (i.e., Bank0, Bank1, Bank2, and Bank3) of the bank group are refreshed, that is, the refresh of two adjacent addresses is completed for all banks in the bank group.

Referring to FIG. 2, an address output signal Addr Counter Output represents the first address stored by the address generator 102. When the number of first refresh operations performed by the refresh control circuit 101 is less than m, the first address n stored in the address generator 102 remains unchanged, and the address output signal Addr Counter Output keeps to be the first address n. After the memory cells corresponding to two adjacent addresses in all banks of the bank group are refreshed, that is, when the number of first refresh operations performed by the refresh control circuit 101 is equal to m, the address generator 102 changes the first address n in response to the second clock signal. The second clock signal includes two pulses. Triggered by the two pulses, the address generator 102 adds 1 to the first address n twice, and the address output signal Addr Counter Output becomes n+2, so as to match the progress of the address refresh. In the m first refresh operations performed later, based on the first address n+2, the address generator 102 continues to output the addresses to be refreshed, so as to refresh the memory cells corresponding to next two adjacent addresses in each bank of the bank group, and so on, the memory cells corresponding to all addresses in each bank of the bank group can be refreshed in sequence.

It is to be understood that, when the first refresh operation is performed, in response to the first clock signal, the address generator 102 maintains the first address unchanged while outputting the address to be refreshed including the first address and the second address; after the number of first refresh operations reaches a preset value m, the address generator 102 changes the first address in response to the second clock signal. In this way, it is ensured that the refresh operations are performed without omission, and the integrity of the address is maintained.

Figure 3:
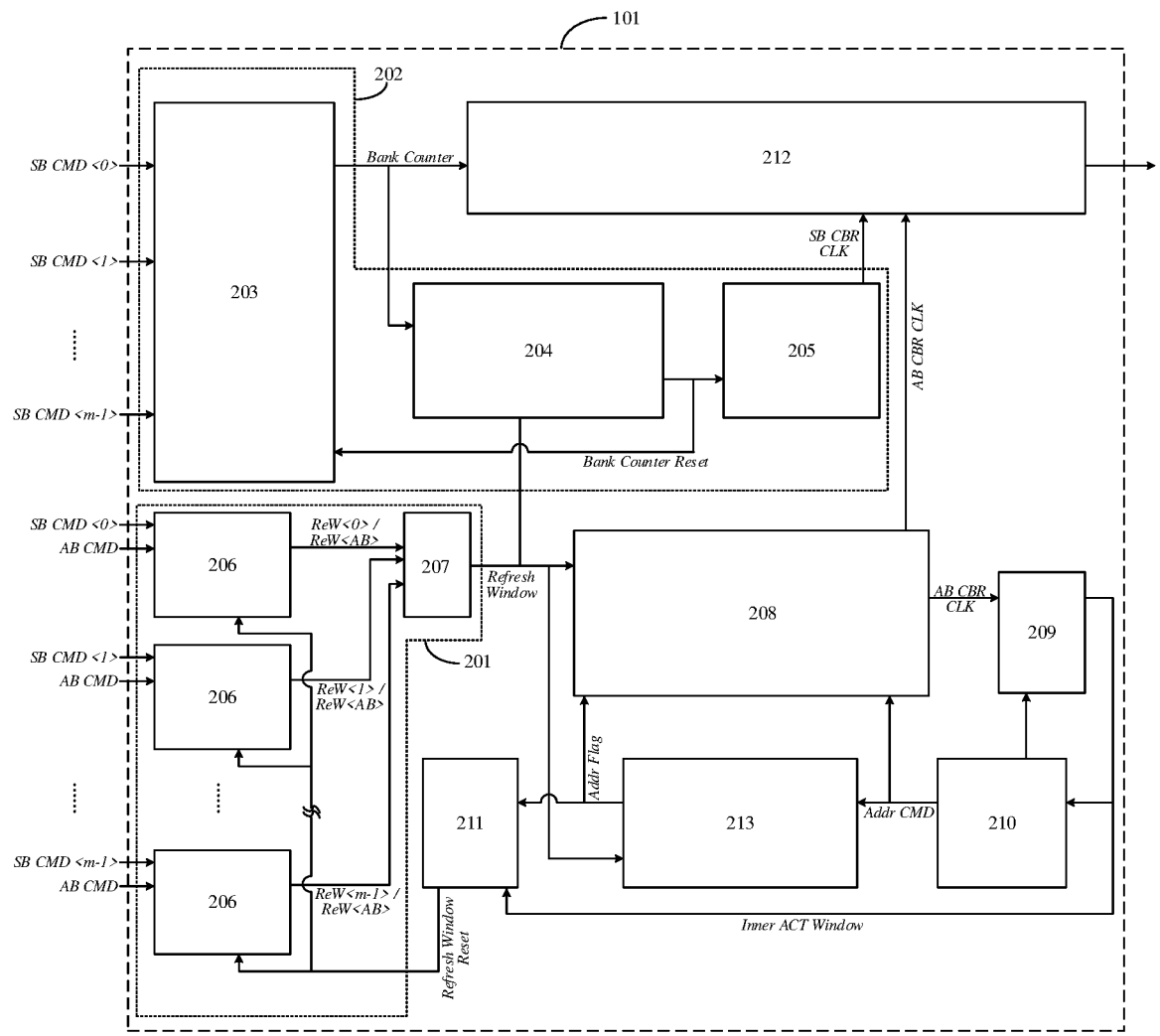
FIG. 3 is schematic structure diagram 2 of a refresh address generation circuit provided by an embodiment of the present disclosure.
Figure 4:
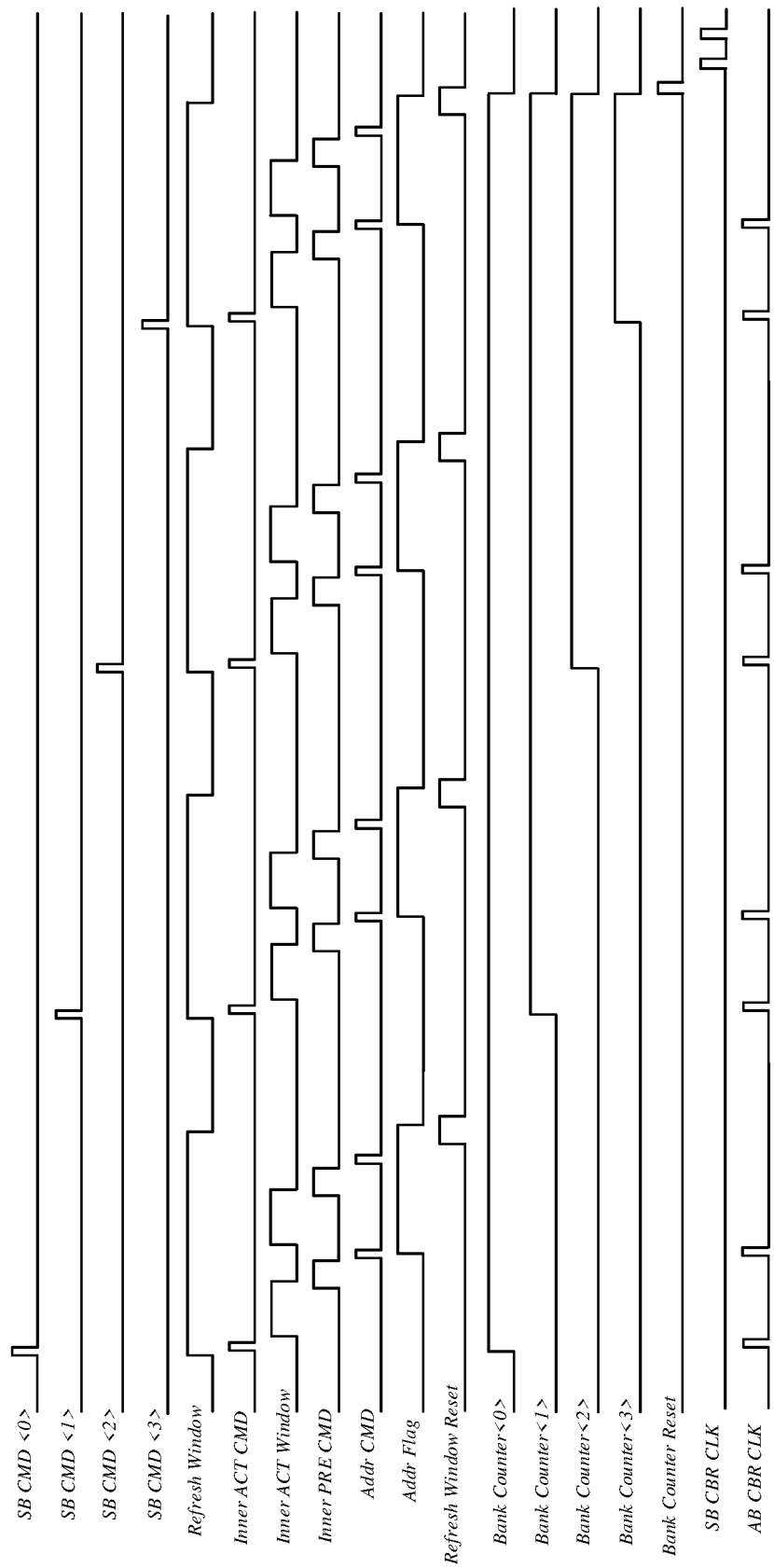
FIG. 4 is schematic signal diagram 2 of a refresh address generation circuit provided by an embodiment of the present disclosure.
Figure 5:
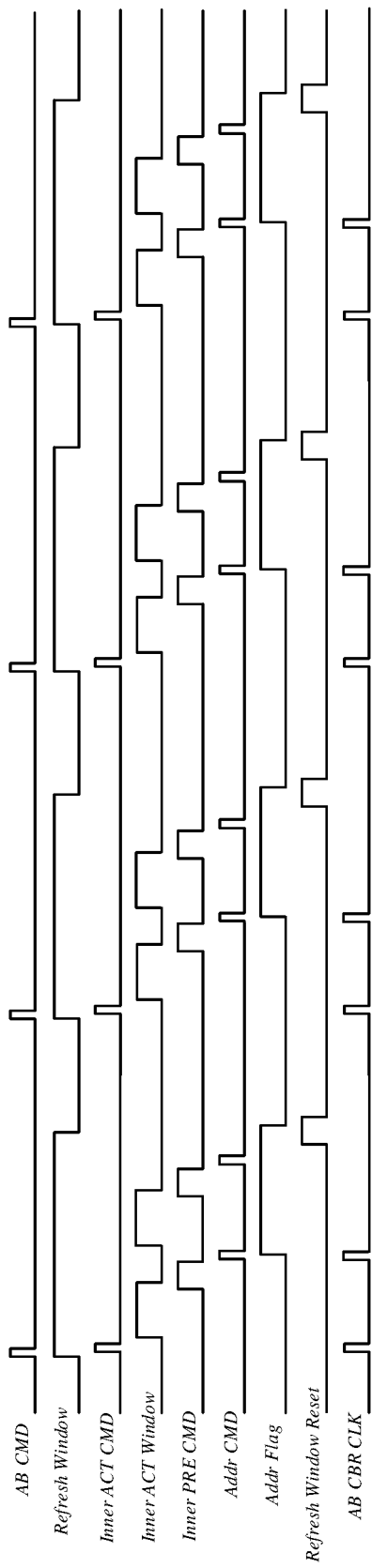
FIG. 5 is schematic signal diagram 3 of a refresh address generation circuit provided by an embodiment of the present disclosure.

FIG. 3 is an optional structure diagram of the refresh control circuit 101 shown in FIG. 1. FIG. 4 and FIG. 5 are schematic signal diagrams corresponding to FIG. 3.

It is to be noted that FIG. 4 shows a signal timing sequence when the refresh control circuit 101 receives multiple first refresh commands SB CMD in sequence and performs the first refresh operations, taking that the preset value m of the number of first refresh commands SB CMD is 4 as an example. FIG. 5 shows a signal timing sequence when the refresh control circuit 101 receives a second refresh command AB CMD and performs a second refresh operation.

Moreover, in FIG. 4 and FIG. 5, waveforms of four cycles of all signals, except the first refresh command SB CMD, the counting signal Bank Counter, the counting reset signal Bank Counter reset, and the SameBank refresh clock signal SB CBR CLK, are shown. If the waveform of each cycle includes two valid pulses, the valid pulse earlier in the timing sequence is a first pulse, and the valid pulse later in the timing sequence is a second pulse. The waveforms of signals in the subsequent figures are also divided according to the similar rules, and will not be repeated hereafter.

In some embodiments of the present disclosure, as shown in FIG. 3 and FIG. 4, the refresh control circuit 101 includes: a refresh window signal generation circuit 201 and a clock pulse generation circuit 202.

The refresh window signal generation circuit 201 is configured to receive multiple first refresh commands SB CMD (i.e., SB CMD<0> to SB CMD<m−1> shown in FIG. 3) and a refresh window reset signal Refresh Window Reset, and generate a refresh window signal Refresh Window according to the multiple first refresh commands SB CMD and the refresh window reset signal Refresh Window Reset. Referring to FIG. 4, the pulse duration of the refresh window signal Refresh Window is the window time during which the refresh control circuit 101 performs a refresh operation, and the refresh window reset signal Refresh Window Reset is used to reset the refresh window signal generation circuit 201 after a refresh operation is finished. The refresh operation performed by the refresh control circuit 101 is the first refresh operation, that is, the first refresh operation is performed to the bank corresponding to the first refresh command SB CMD.

The clock pulse generation circuit 202 is coupled to the refresh window signal generation circuit 201, and is configured to receive the refresh window signal Refresh Window and the first refresh commands SB CMD, and generate the first clock signal when the number of first refresh commands SB CMD received by the clock pulse generation circuit 202 is less than or equal to m and before the m-th first refresh operation is finished, or generate the second clock signal after the m-th first refresh operation is finished. Referring to FIG. 4, the SameBank refresh clock signal includes the first clock signal and the second clock signal, that is, the first clock signal and the second clock signal are values of the SameBank refresh clock signal in different periods of time.

In some embodiments of the present disclosure, as shown in FIG. 3 and FIG. 4, the clock pulse generation circuit 202 includes: a counting circuit 203, a counting reset signal generation circuit 204 and a first pulse generation subcircuit 205.

The counting circuit 203 is configured to receive the first refresh commands SB CMD and a counting reset signal Bank Counter Reset, count the first refresh commands SB CMD and output counting signals Bank Counter, and reset according to the counting reset signal Bank Counter Reset.

The counting reset signal generation circuit 204 is coupled to the counting circuit 203 and the refresh window signal generation circuit 201, and is configured to generate the counting reset signal Bank Counter Reset after the m-th first refresh operation is finished.

The first pulse generation subcircuit 205 is coupled to the counting reset signal generation circuit 204, and is configured to generate the first clock signal according to the counting signals BankCounter when the number of first refresh commands SB CMD is less than m, or generate the second clock signal according to the counting reset signal Bank Counter Reset when the number of first refresh commands SB CMD is equal to m.

In some embodiments of the present disclosure, as shown in FIG. 3 and FIG. 4, the refresh window signal generation circuit 201 includes: multiple refresh window sub-signal generation circuits 206 and a refresh window sub-signal processing circuit 207.

The multiple refresh window sub-signal generation circuits 206 are configured to receive the refresh window reset signal Refresh Window Reset and correspondingly receive the multiple first refresh commands SB CMD in sequence, and output multiple refresh window sub-signals ReW (i.e., ReW<0> to ReW<m−1> shown in FIG. 3) in sequence according to the multiple first refresh commands SB CMD and the refresh window reset signal Refresh Window Reset.

The refresh window sub-signal processing circuit 207 is coupled to the multiple refresh window sub-signal generation circuits 206, and is configured to receive the multiple refresh window sub-signals ReW in sequence, perform a logical operation on the refresh window sub-signals ReW, and output the refresh window signal Refresh Window.

In some embodiments of the present disclosure, as shown in FIG. 3 and FIG. 5, the refresh control circuit 101 is further configured to receive the second refresh command AB CMD and perform the second refresh operation.

The multiple refresh window sub-signal generation circuits 206 are further configured to receive the second refresh command AB CMD and the refresh window reset signal Refresh Window Reset simultaneously, and generate the same multiple refresh window sub-signals ReW according to the second refresh command AB CMD and the refresh window reset signal Refresh Window Reset in one-to-one correspondence.

The refresh window sub-signal processing circuit 207 is further configured to receive the multiple refresh window sub-signals ReW, perform the logical operation on the refresh window sub-signals ReW, and output the refresh window signal Refresh Window.

It is to be noted that the second refresh operation is performed simultaneously to all banks in the bank group, namely all bank refresh. When the refresh control circuit 101 receives the second refresh command AB CMD and performs the second refresh operation, the first refresh command SB CMD does not include a valid pulse and keeps at low level, that is, the first refresh command SB CMD is invalid, then the counting signal Bank Counter keeps at low level, and the counting reset signal Bank Counter Reset does not produce a valid pulse and keeps at low level.

Correspondingly, when the refresh control circuit 101 receives multiple first refresh commands SB CMD in sequence and performs the first refresh operation, the second refresh command AB CMD does not include the valid pulses and keeps at low level, that is, the second refresh command AB CMD is invalid.

In the embodiments of the present disclosure, when the multiple refresh window sub-signal generation circuits 206 receive multiple first refresh command SB CMD, since the multiple first refresh commands SB CMD are different, the generated multiple refresh window sub-signals ReW are different. The multiple refresh window sub-signal generation circuits 206 may generate multiple same refresh window sub-signals ReW when receiving the second refresh command AB CMD.

It is to be understood that the refresh control circuit 101 may receive multiple first refresh commands SB CMD in sequence and perform the first refresh operations as needed, or receive the second refresh command AB CMD and perform the second refresh operation. That is, two types of refresh operations may be performed flexibly by one refresh control circuit 101, which improves the compatibility of the circuit.

In some embodiments of the present disclosure, as shown in FIG. 3, the refresh control circuit 101 also includes: a second pulse generation subcircuit 208, an inner refresh window signal generation circuit 209, an address command signal generation circuit 210 and a refresh window reset signal generation circuit 211.

In the embodiments of the present disclosure, referring to FIG. 3, FIG. 4 and FIG. 5, the second pulse generation subcircuit 208 is coupled to the refresh window sub-signal processing circuit 207, and is configured to receive the refresh window signal Refresh Window and an address command signal Addr CMD, generate a first pulse of a third clock signal AB CBR CLK when the refresh control circuit 101 starts to perform the first refresh operation or the second refresh operation, and output a second pulse of the third clock signal AB CBR CLK according to a first pulse of the address command signal Addr CMD, so as to output the third clock signal AB CBR CLK.

Referring to FIG. 4, when the refresh control circuit 101 receives multiple first refresh commands SB CMD in sequence and performs the first refresh operations, the first pulse of the third clock signal AB CBR CLK is aligned to a valid pulse of each of multiple first refresh commands SB CMD<0> to SB CMD<3>, that is, the first pulse of the third clock signal AB CBR CLK is generated when the refresh control circuit 101 starts to perform the first refresh operation; the second pulse of the third clock signal AB CBR CLK is aligned to the first pulse of the address command signal Addr CMD, that is, the second pulse of the third clock signal AB CBR CLK is generated according to the first pulse of the address command signal Addr CMD.

Referring to FIG. 5, when the refresh control circuit 101 receives the second refresh command AB CMD and performs the second refresh operation, the first pulse of the third clock signal AB CBR CLK is aligned to the valid pulse of the second refresh command AB CMD, that is, the first pulse of the third clock signal AB CBR CLK is generated when the refresh control circuit 101 starts to perform the second refresh operation; the second pulse of the third clock signal AB CBR CLK is aligned to the first pulse of the address command signal Addr CMD, that is, the second pulse of the third clock signal AB CBR CLK is generated according to the first pulse of the address command signal Addr CMD.

In the embodiments of the present disclosure, referring to FIG. 3, FIG. 4 and FIG. 5, the inner refresh window signal generation circuit 209 is configured to receive the third clock signal AB CBR CLK, and generate an inner refresh window signal Inner ACT Window according to the third clock signal AB CBR CLK. The first pulse of the inner refresh window signal Inner ACT Window is generated after the first pulse of the third clock signal AB CBR CLK and ended before the second pulse of the third clock signal AB CBR CLK is generated. The second pulse of the inner refresh window signal Inner ACT Window is generated after the second pulse of the third clock signal AB CBR CLK and ended before the pulse of the refresh window signal Refresh Window is ended. It is to be noted that the refresh controller in a memory will receive the inner refresh window signal Inner ACT Window and the address to be refreshed, and refresh the memory cells according to the inner refresh window signal Inner ACT Window, so the duration of the inner refresh window signal Inner ACT Window is the time of refreshing the memory cells.

In the embodiments of the present disclosure, referring to FIG. 3, FIG. 4 and FIG. 5, the address command signal generation circuit 210 is configured to generate the first pulse and the second pulse of the address command signal Addr CMD according to a falling edge of the inner refresh window signal Inner ACT Window. The first pulse of the address command signal Addr CMD is used to generate the second pulse of the inner refresh window signal Inner ACT Window and the second pulse of the third clock signal AB CBR CLK. A falling edge of the inner refresh window signal Inner ACT Window represents the end of refresh of an address, thus generating the address command signal Addr CMD to control generation of the next address.

Referring to FIG. 4 and FIG. 5, the valid pulses of the inner refresh window signal Inner ACT Window may be compressed and shifted to obtain valid pulses of an inner pre-command signal Inner PRE CMD, that is, the falling edges of the inner pre-command signal Inner PRE CMD are obtained according to the falling edges of the inner refresh window signal Inner ACT Window first; then, the address command signal generation circuit 210 may generate the first pulse and the second pulse of the address command signal Addr CMD according to the falling edges of the inner pre-command signal Inner PRE CMD.

In the embodiments of the present disclosure, referring to FIG. 3, FIG. 4 and FIG. 5, the refresh window reset signal generation circuit 211 is configured to receive the inner refresh window signal Inner ACT Window and generate a pulse of the refresh window reset signal Refresh Window Reset according to the falling edge of the second pulse of the inner refresh window signal Inner ACT Window.

In some embodiments of the present disclosure, as shown in FIG. 3, the refresh control circuit 101 also includes a signal selection circuit 212.

In the embodiments of the present disclosure, referring to FIG. 3, FIG. 4 and FIG. 5, the signal selection circuit 212 is coupled to the counting circuit 203, the first pulse generation subcircuit 205 and the second pulse generation subcircuit 208, and is configured to receive the counting signals Bank Counter, the first clock signal, the second clock signal (the first clock signal and the second clock signal are the Same-Bank refresh clock signal SB CBR CLK), and the third clock signal AB CBR CLK, output the first clock signal or the second clock signal according to the counting signals Bank Counter when the refresh control circuit 101 performs the first refresh operation, or output the third clock signal AB CBR CLK according to the counting signals Bank Counter when the refresh control circuit 101 performs the second refresh operation.

Referring to FIG. 3 and FIG. 4, when the refresh control circuit 101 performs the first refresh operation, if any counting signal Bank Counter is at high level, the signal selection circuit 212 outputs the first clock signal, that is, the output SameBank refresh clock signal SB CBR CLK is at low level; if all the counting signals Bank Counter jump to low level, the signal selection circuit 212 outputs the second clock signal, that is, two continuous valid pulses in the SameBank refresh clock signal SB CBR CLK are output.

Referring to FIG. 3 and FIG. 5, when the refresh control circuit 101 performs the second refresh operation, if all counting signals Bank Counter keep at low level (not shown in FIG. 5), the signal selection circuit 212 outputs the valid pulse in the third clock signal AB CBR CLK.

In some embodiments of the present disclosure, as shown in FIG. 3, the refresh control circuit 101 also includes an address flag signal generation circuit 213.

In some embodiments of the present disclosure, referring to FIG. 3, FIG. 4 and FIG. 5, the address flag signal generation circuit 213 is coupled to the address command signal generation circuit 210 and the refresh window sub-signal processing circuit 207, and is configured to receive the address command signal Addr CMD and the refresh window signal Refresh Window, generate a rising edge of an address flag signal Addr Flag according to the first rising edge of the address command signal Addr CMD, and generate a falling edge of the address flag signal Addr Flag according to the falling edge of the refresh window signal Refresh Window.

Figure 6:
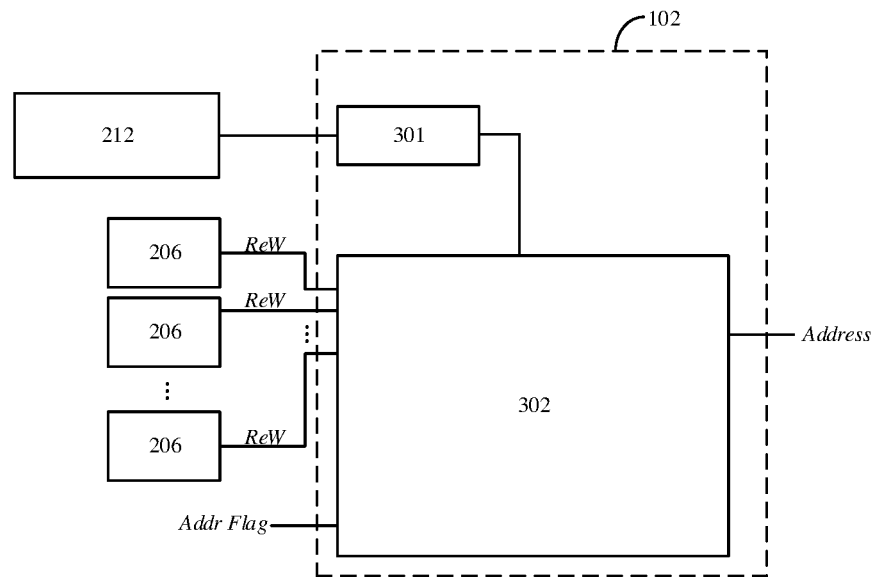
FIG. 6 is schematic structure diagram 3 of a refresh address generation circuit provided by an embodiment of the present disclosure.

In some embodiments of the present disclosure, as shown in FIG. 6, the address generator 102 includes: an address counter 301 and an address processing circuit 302.

The address counter 301 is coupled to the signal selection circuit 212, and is configured to prestore the first address and receive from the signal selection circuit 212 the SameBank refresh clock signal SB CBR CLK or the third clock signal AB CBR CLK (not shown in FIG. 6). The address counter 301 may change the first address to a third address according to the second clock signal in the SameBank refresh clock signal SB CBR CLK, or change the first address and output the fourth address and the fifth address according to the third clock signal AB CBR CLK.

The address processing circuit 302 is coupled to the address counter 301 and the refresh window sub-signal generation circuits 206, and is configured to receive the address flag signal Addr Flag when the refresh control circuit 101 performs the first refresh operation, obtain the first address, and output the first address before the rising edge of the address flag signal Addr Flag, or output the second address after the rising edge of the address flag signal Addr Flag. The address processing circuit 302 is further configured to obtain the fourth address and the fifth address in sequence when the refresh control circuit 101 performs the second refresh operation, and output the fourth address and the fifth address in sequence according to the multiple refresh window sub-signals ReW.

In the embodiments of the present disclosure, when the refresh control circuit 101 performs the first refresh operation, the first address is a prestored address, and the second address is obtained by inverting the lowest bit of the first address, that is, the first address and the second address are two continuous addresses, so the third address is obtained by adding the value 2 to the first address, which avoids repeating the first refresh operation for the same address. In this way, after the first refresh operations for the first address and the second address are performed to all banks, the first address is added by the value 2 to become the third address. The refresh control circuit 101 may use the third address as the prestored address to perform the first refresh operations of a new round, so as to ensure that the first refresh operations are performed without omission.

In the embodiments of the present disclosure, when the refresh control circuit 101 performs the second refresh operation, the first address is the prestored address, the fourth address is obtained by adding the value 1 to the first address, and the fifth address is obtained by adding the value 1 to the fourth address, that is, the first address, the fourth address and the fifth address are three continuous addresses. In this way, the refresh control circuit 101 may perform the second refresh operation for the addresses of all banks sequentially according to the order of the addresses, so as to ensure that the second refresh operation is performed without omission.

In the embodiments of the present disclosure, referring to FIG. 4 and FIG. 6, when the signal selection circuit 212 outputs the second clock signal (i.e., two valid pulses in SB CBR CLK) to the address counter 301, the address counter 301 may add the value 2 to the first address according to the two valid pulses of the second clock signal to obtain the third address. When the signal selection circuit 212 outputs the third clock signal AB CBR CLK to the address counter 301, the address counter 301 may add the value 1 to the first address according to the first pulse of the third clock signal AB CBR CLK to obtain the fourth address, and then the address counter 301 may add the value 1 to the fourth address according to the second pulse of the third clock signal AB CBR CLK to obtain the fifth address.

Figure 7:
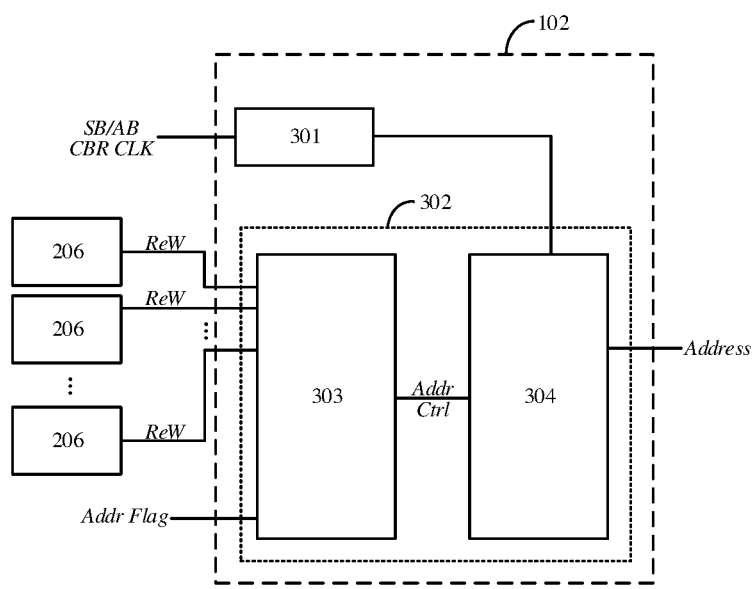
FIG. 7 is schematic structure diagram 4 of a refresh address generation circuit provided by an embodiment of the present disclosure.

In some embodiments of the present disclosure, as shown in FIG. 7, the address processing circuit 302 includes: a control signal generation circuit 303 and an address selection circuit 304.

The control signal generation circuit 303 is coupled to the refresh window sub-signal generation circuits 206 and the address flag signal generation circuit 213, and is configured to receive the multiple refresh window sub-signals ReW and the address flag signal Addr Flag, and generate an address control signal Addr Ctrl according to the multiple refresh window sub-signals ReW and the address flag signal Addr Flag.

The address selection circuit 304 is coupled to the address counter 301 and the control signal generation circuit 303, and is configured to output the first address according to the address control signal Addr Ctrl when the refresh control circuit 101 receives the first refresh command SB CMD, or invert the first address according to the address control signal Addr Ctrl to obtain and output the second address. The address selection circuit 304 is further configured to output the fourth address and the fifth address in response to the address control signal Addr Ctrl when the refresh control circuit 101 receives the second refresh command AB CMD.

Figure 8:
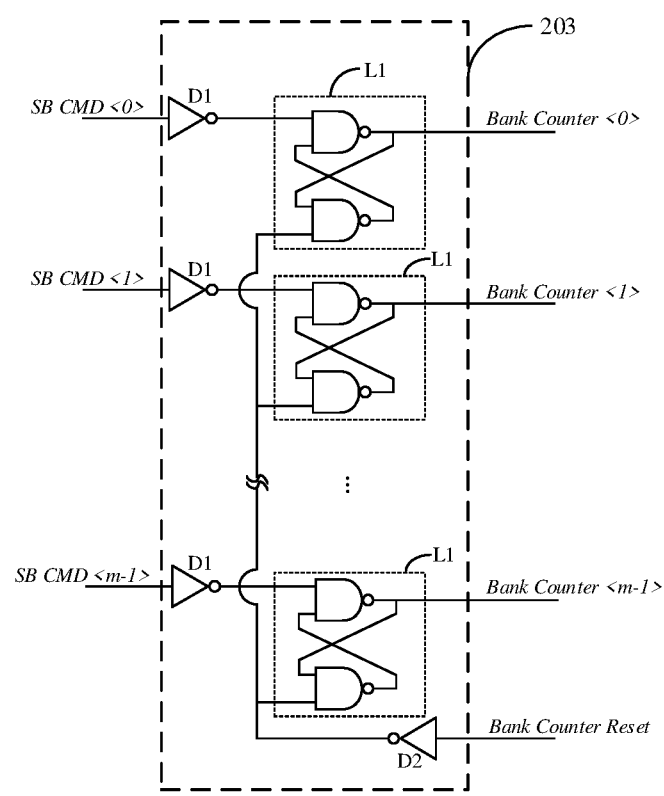
FIG. 8 is schematic structure diagram 5 of a refresh address generation circuit provided by an embodiment of the present disclosure.

In some embodiments of the present disclosure, as shown in FIG. 8, the counting circuit 203 includes: multiple first inverters D1, multiple first latches L1 and a second inverter D2. Input ends of the multiple first inverters D1 receive the multiple first refresh commands SB CMD in sequence. The input end of the second inverter D2 receives the counting reset signal Bank Counter Reset. Set ends of the multiple first latches L1 are connected to output ends of the multiple first inverters D1 correspondingly, and reset ends of the multiple first latches L1 are all connected to the output end of the second inverter D2. The multiple first latches L1 output the multiple counting signals Bank Counter sequentially.

Figure 9:
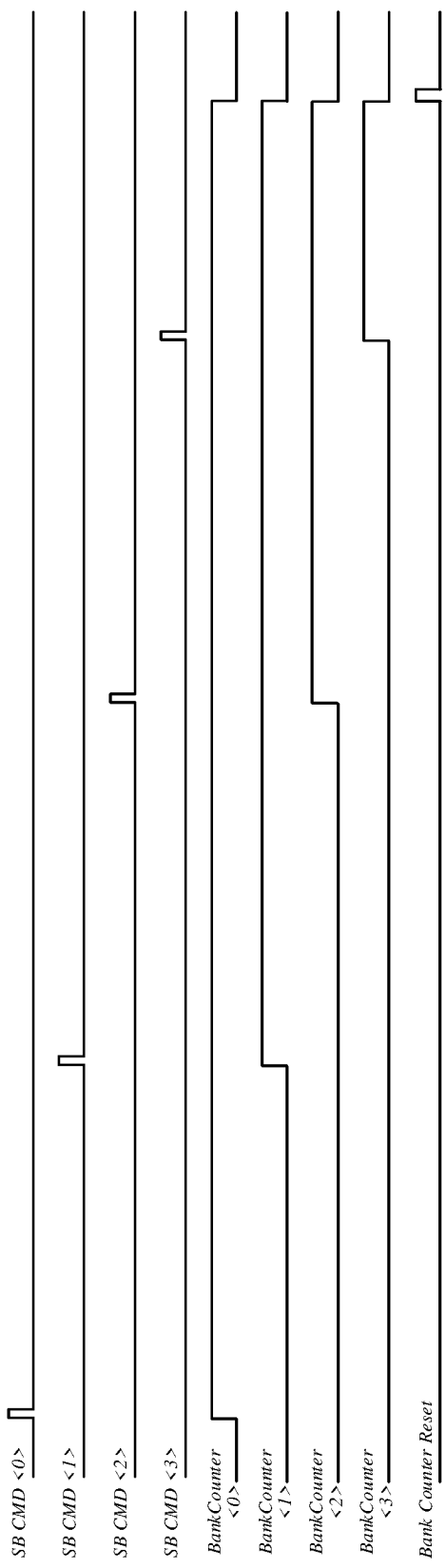
FIG. 9 is schematic signal diagram 4 of a refresh address generation circuit provided by an embodiment of the present disclosure.

In the embodiments of the present disclosure, FIG. 9 is a signal timing diagram when m is 4. In combination with FIG. 8 and FIG. 9, the valid pulse in each first refresh command SB CMD may trigger the corresponding counting signal Bank Counter to jump from low level to high level, for example, the pulse in the first refresh command SB CMD<0> may trigger a counting signal Bank Counter<0> to change from low level to high level, similarly, the pulses in the first refresh commands SB CMD<1>, SB CMD<2> and SB CMD<3> may trigger the respective counting signals Bank Counter<1>, Bank Counter<2> and Bank Counter<3> to change from low level to high level. The valid pulse in the counting reset signal Bank Counter Reset may trigger all counting signals Bank Counter<0> to Bank Counter<3> to jump from high level to low level. The valid pulse in the counting reset signal Bank Counter Reset is generated after the refresh control circuit completes the m-th first refresh operation.

Figure 10:
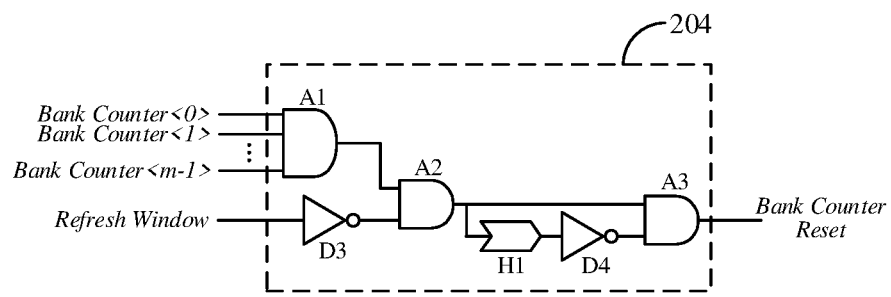
FIG. 10 is schematic structure diagram 6 of a refresh address generation circuit provided by an embodiment of the present disclosure.

In some embodiments of the present disclosure, as shown in FIG. 10, the counting reset signal generation circuit 204 includes: a first AND gate A1, a third inverter D3, a second AND gate A2, a first delayer H1, a fourth inverter D4 and a third AND gate A3. The input ends of the first AND gate A1 receive the multiple counting signals Bank Counter. The input end of the third inverter D3 receives the refresh window signal Refresh Window. The input ends of the second AND gate A2 are connected to the output end of the first AND gate A1 and the output end of the third inverter D3 respectively. The input end of the first delayer H1 is connected to the output end of the second AND gate A2. The input end of the fourth inverter D4 is connected to the output end of the first delayer H1. The input ends of the third AND gate A3 are connected to the output end of the second AND gate A2 and the output end of the fourth inverter D4 respectively. The third AND gate A3 outputs the counting reset signal Bank Counter Reset.

Figure 11:
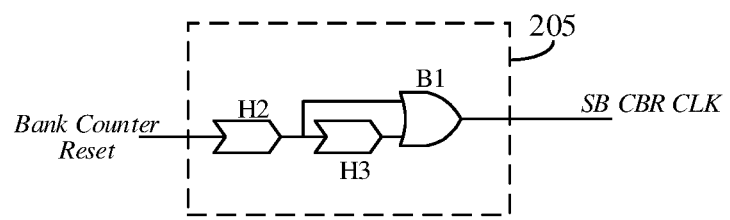
FIG. 11 is schematic structure diagram 7 of a refresh address generation circuit provided by an embodiment of the present disclosure.

In some embodiments of the present disclosure, as shown in FIG. 11, the first pulse generation subcircuit 205 includes: a second delayer H2, a third delayer H3 and a first OR gate B1. The input end of the second delayer H2 receives the counting reset signal Counter Reset. The input end of the third delayer H3 is connected to the output end of the second delayer H2. The input ends of the first OR gate B1 are connected to the output end of the second delayer H2 and the output end of the third delayer H3 respectively. The first OR gate B1 outputs the first clock signal or the second clock signal, i.e., the first OR gate B1 outputs the SameBank refresh clock signal SB CBR CLK.

Figure 12:
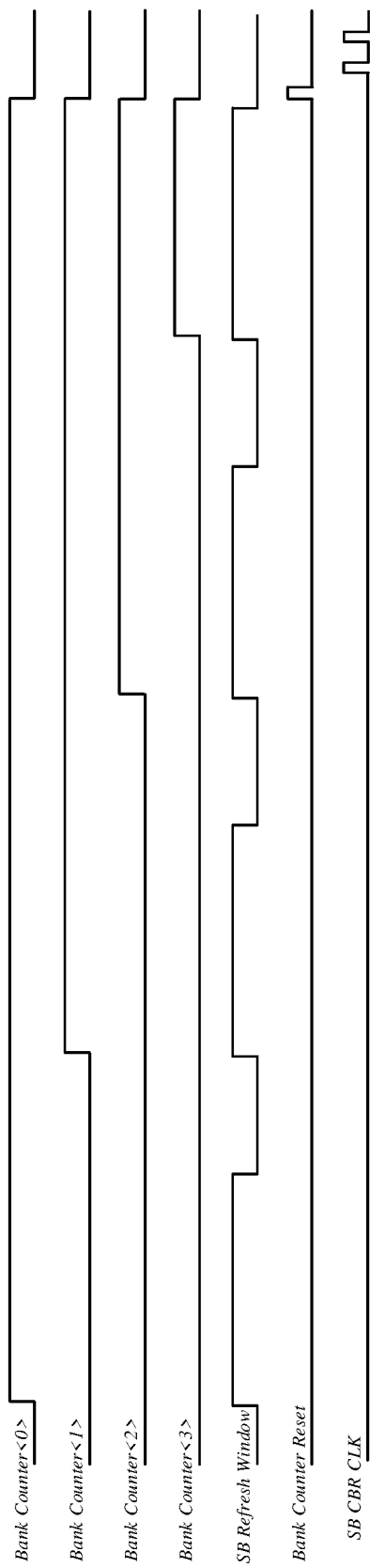
FIG. 12 is schematic signal diagram 5 of a refresh address generation circuit provided by an embodiment of the present disclosure.

In the embodiments of the present disclosure, FIG. 12 is a signal timing diagram when m is 4. In combination with FIG. 10, FIG. 11 and FIG. 12, when the first refresh operation is performed, the pulse in the counting reset signal Bank Counter Reset is generated based on the counting signals Bank Counter<0>, Bank Counter<1>, Bank Counter<2>, and Bank Counter<3> and the refresh window signal Refresh Window. A valid pulse in the counting reset signal Bank Counter Reset generates two valid pulses in the SB CBR CLK after passing through the second delayer H2, the third delayer H3 and the first OR gate B1. The first delayer H1 may delay the received signal by 0 ns to 2 ns, the second delayer H2 may delay the received signal by 1 ns to 3 ns, and the third delayer H3 may delay the received signal by 4 ns to 6 ns.

Figure 13:
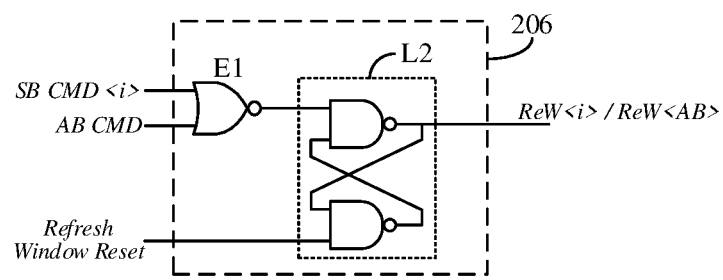
FIG. 13 is schematic structure diagram 8 of a refresh address generation circuit provided by an embodiment of the present disclosure.

In some embodiments of the present disclosure, as shown in FIG. 13, the refresh window sub-signal includes: a first refresh window sub-signal ReW<i> or a second refresh window sub-signal ReW<AB>. Each refresh window sub-signal generation circuit 206 includes: a first NOR gate E1 and a second latch L2. When the refresh control circuit performs the first refresh operation, a first input end of the first NOR gate E1 receives the corresponding first refresh command SB CMD<i>, or when the refresh control circuit performs the second refresh operation, a second input end of the first NOR gate E1 receives the second refresh command AB CMD. The set end of the second latch L2 is connected to the output end of the first NOR gate E1, and the reset end of the second latch L2 receives the refresh window reset signal Refresh Window Reset. When the refresh control circuit performs the first refresh operation, the second latch L2 outputs the corresponding first refresh window sub-signal ReW<i>, or when the refresh control circuit performs the second refresh operation, the second latch outputs the corresponding second refresh window sub-signal ReW<AB>. Here, i is greater than or equal to 0 and less than or equal to m−1, the first refresh command SB CMD<i> is any one of the multiple first refresh commands, and the first refresh window sub-signal ReW<i> corresponds to the first refresh command SB CMD<i>.

Figure 14:
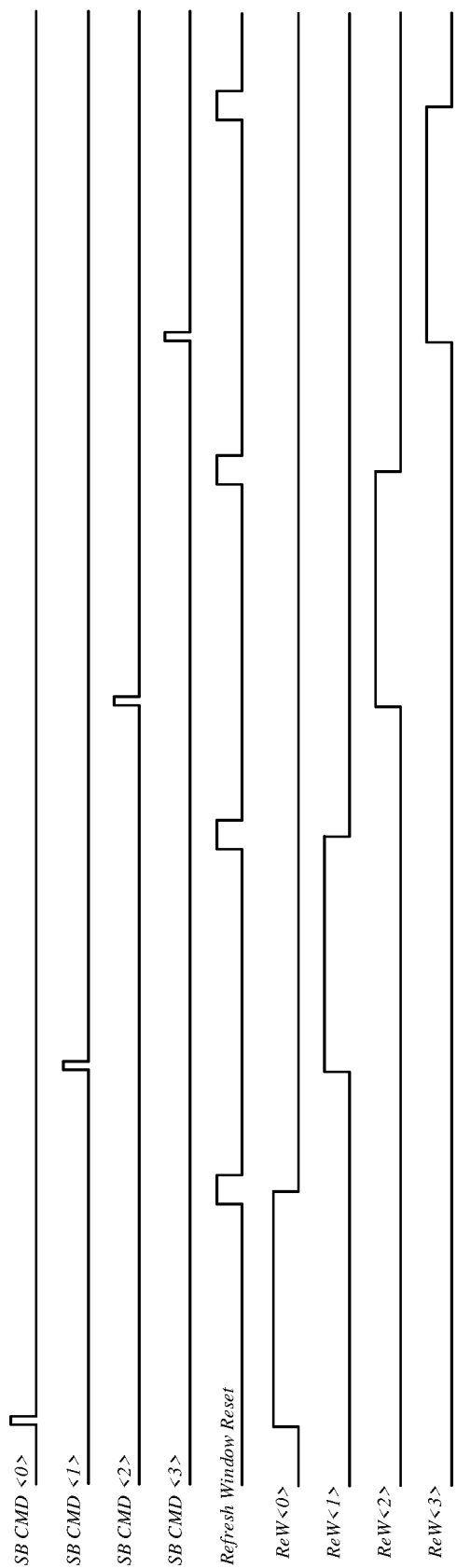
FIG. 14 is schematic signal diagram 6 of a refresh address generation circuit provided by an embodiment of the present disclosure.

In the embodiments of the present disclosure, FIG. 14 is a signal timing diagram when m is 4. In combination with FIG. 13 and FIG. 14, when the refresh control circuit performs the first refresh operation, the valid pulse in the first refresh command SB CMD<0> triggers the first refresh window sub-signal ReW<0> to jump from low level to high level, the first valid pulse in the refresh window reset signal Refresh Window Reset triggers the first refresh window sub-signal ReW<0> to jump from high level to low level, so as to obtain the valid pulse of the first refresh window sub-signal ReW<0>. Similarly, the valid pulses in the first refresh commands SB CMD<1>, SB CMD<2> and SB CMD<3> trigger the respective first refresh window sub-signals ReW<1>, ReW<2> and ReW<3> to jump from low level to high level, and the second valid pulse to the fourth valid pulse in the refresh window reset signal Refresh Window Reset trigger respectively the first refresh window sub-signals ReW<1>, ReW<2> and ReW<3> to jump from high level to low level, so as to obtain the valid pulses of the first refresh window reset signals ReW<1>, ReW<2> and ReW<3>.

Figure 15:
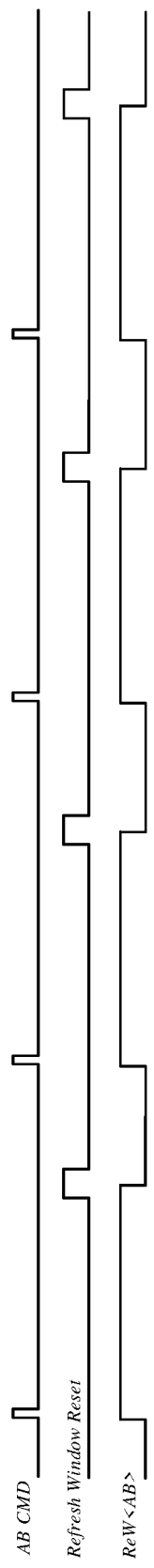
FIG. 15 is schematic signal diagram 7 of a refresh address generation circuit provided by an embodiment of the present disclosure.

In the embodiments of the present disclosure, in combination with FIG. 13 and FIG. 15, when the refresh control circuit performs the second refresh operation, the valid pulse in the second refresh command AB CMD triggers the second refresh window sub-signal ReW<AB> to jump from low level to high level, the valid pulse in the refresh window reset signal Refresh Window Reset triggers the second refresh window sub-signal ReW<AB> to jump from high level to low level, so as to obtain the valid pulse of the second refresh window sub-signal ReW<AB>.

Figure 16:
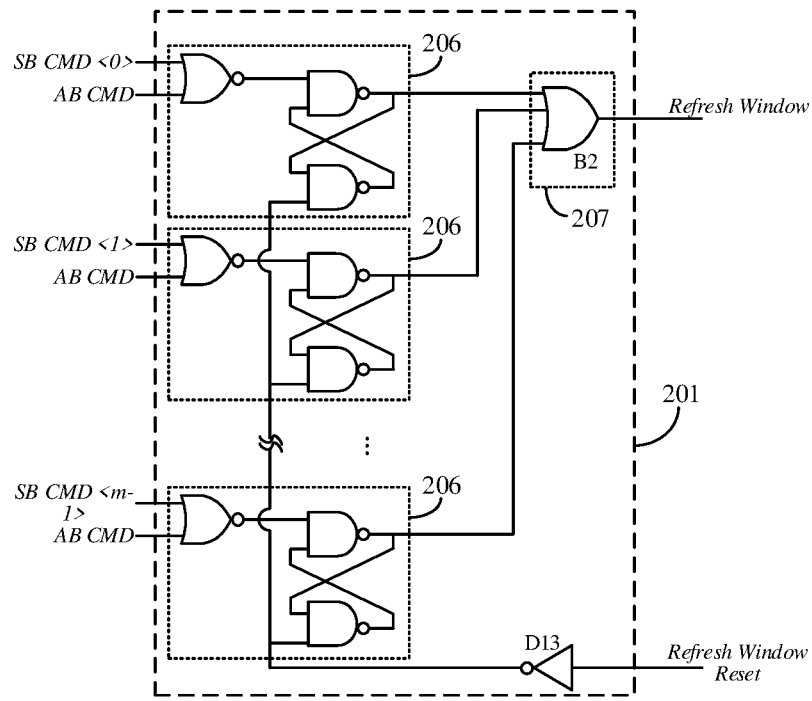
FIG. 16 is schematic structure diagram 9 of a refresh address generation circuit provided by an embodiment of the present disclosure.

In some embodiments of the present disclosure, in combination with FIG. 13 and FIG. 16, the refresh window sub-signal processing circuit 207 includes: a second OR gate B2. When the refresh control circuit performs the first refresh operation, the input ends of the second OR gate B2 receive the multiple first refresh window sub-signals ReW<i> respectively from the multiple refresh window sub-signal generation circuits 206, or when the refresh control circuit performs the second refresh operation, the input ends of the second OR gate receive the same multiple second refresh window sub-signals ReW<AB> respectively from the multiple refresh window sub-signal generation circuits 206. The second OR gate B2 outputs the refresh window signal Refresh Window.

In the embodiments of the present disclosure, referring to FIG. 16, the refresh window signal generation circuit 201 also includes a thirteenth inverter D13. The refresh window reset signal Refresh Window Reset is transmitted to multiple refresh window sub-signal generation circuits 206 after passing through the thirteenth inverter D13.

In the embodiments of the present disclosure, referring to FIG. 14 and FIG. 16, when refresh control circuit performs the first refresh operation, since all the first refresh window sub-signals ReW<0> to ReW<3> are valid at high level, the refresh window signal Refresh Window output by the second OR gate B2 includes all valid pulses in the first refresh window sub-signals ReW<0> to ReW<3>.

In the embodiments of the present disclosure, referring to FIG. 15 and FIG. 16, when the refresh control circuit performs the second refresh operation, the second OR gate B2 receives the same multiple second refresh window sub-signals ReW<AB>, and the refresh window signal Refresh Window output by the second OR gate B2 has the same waveform as the second refresh window sub-signal ReW<AB>.

Figure 17:
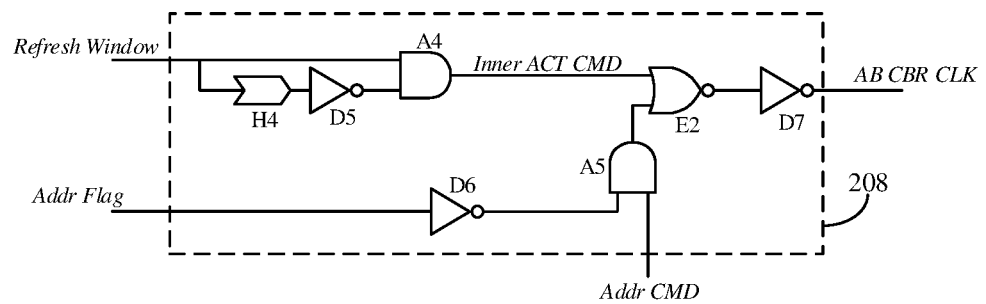
FIG. 17 is schematic structure diagram 10 of a refresh address generation circuit provided by an embodiment of the present disclosure.

In some embodiments of the present disclosure, as shown in FIG. 17, the second pulse generation subcircuit 208 includes: a fourth delayer H4, a fifth inverter D5, a fourth AND gate A4, a sixth inverter D6, a fifth AND gate A5, a second NOR gate E2 and a seventh inverter D7. The input end of the fourth delayer H4 receives the refresh window signal Refresh Window. The input end of the fifth inverter D5 is connected to the output end of the fourth delayer H4. The first input end of the fourth AND gate A4 receives the refresh window signal Refresh Window, and the second input end of the fourth AND gate A4 is connected to the output end of the fifth inverter D5. The input end of the sixth inverter D6 receives the address flag signal Addr Flag. The first input end of the fifth AND gate A5 is connected to the output end of the sixth inverter D6, and the second input end of the fifth AND gate A5 receives the address command signal Addr CMD. The input ends of the second NOR gate E2 are connected to the output end of the fourth AND gate A4 and the output end of the fifth AND gate A5 respectively. The input end of the seventh inverter D7 is connected to the output end of the second NOR gate E2. The seventh inverter D7 outputs the third clock signal AB CBR CLK.

Figure 18:
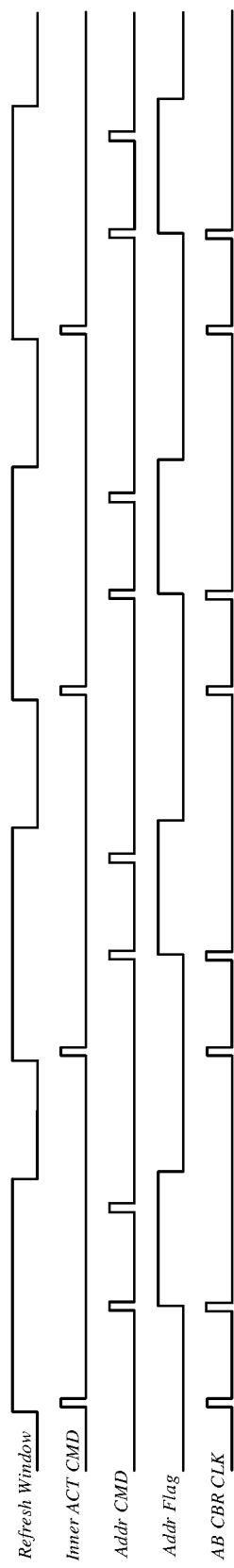
FIG. 18 is schematic signal diagram 8 of a refresh address generation circuit provided by an embodiment of the present disclosure.

In the embodiments of the present disclosure, referring to FIG. 17 and FIG. 18, the fourth delayer H4 may delay the received refresh window signal Refresh Window by 1 ns to 3 ns. Furthermore, the refresh window signal Refresh Window may be converted into an inner activation command signal Inner ACT CMD after passing through the fourth delayer H4, the fifth inverter D5 and the fourth AND gate A4. A pulse of the inner activation command signal Inner ACT CMD corresponds to the rising edge of the refresh window signal Refresh Window, and the pulse forms the first pulse of the third clock signal AB CBR CLK after passing through the second NOR gate E2 and the seventh inverter D7. The second pulse of the third clock signal AB CBR CLK is formed based on the address Flag signal Addr Flag and the address command signal Addr CMD.

Figure 19:
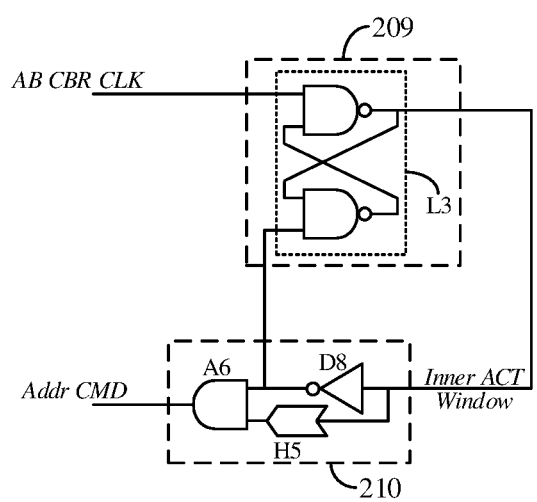
FIG. 19 is schematic structure diagram 11 of a refresh address generation circuit provided by an embodiment of the present disclosure.

In some embodiments of the present disclosure, as shown in FIG. 19, the address command signal generation circuit 210 includes: an eighth inverter D8, a fifth delayer H5 and a sixth AND gate A6. The input end of the eighth inverter D8 receives the inner refresh window signal Inner ACT Window. The input end of the fifth delayer H5 is connected to the input end of the eighth inverter D8 to receive the inner refresh window signal Inner ACT Window. The input ends of the sixth AND gate A6 are connected to the output end of the eighth inverter D8 and the output end of the fifth delayer H5 respectively. The sixth AND gate A6 outputs the address command signal Addr CMD.

Figure 20:
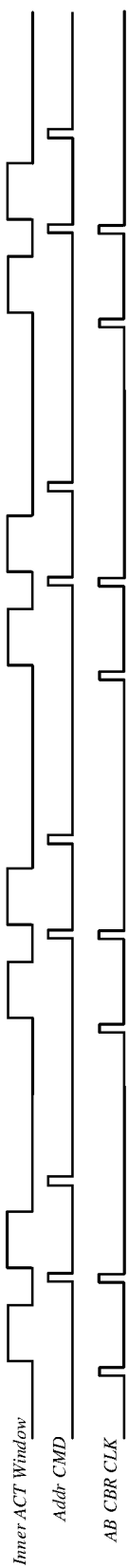
FIG. 20 is schematic signal diagram 9 of a refresh address generation circuit provided by an embodiment of the present disclosure.

In the embodiments of the present disclosure, the fifth delayer H5 may delay the received inner refresh window signal Inner ACT Window by 0 ns to 2 ns. In combination with FIG. 19 and FIG. 20, through the eighth inverter D8, the fifth delayer H5 and the sixth AND gate A6, the first pulse of the inner refresh window signal Inner ACT Window may be converted into the first pulse of the address command signal Addr CMD, and the second pulse of the inner refresh window signal Inner ACT Window may be converted into the second pulse of the address command signal Addr CMD.

In some embodiments of the present disclosure, as shown in FIG. 19, the inner refresh window signal generation circuit 209 includes: a third latch L3. The set end of the third latch L3 receives the third clock signal AB CBR CLK. The reset end of the third latch L3 is connected to the output end of the eighth inverter D8. The third latch L3 outputs the inner refresh window signal Inner ACT Window.

Figure 21:
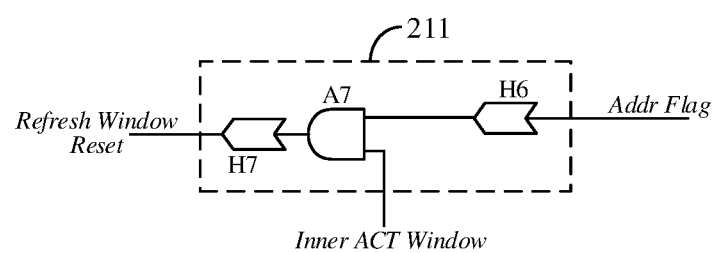
FIG. 21 is schematic structure diagram 12 of a refresh address generation circuit provided by an embodiment of the present disclosure.

In some embodiments of the present disclosure, as shown in FIG. 21, the refresh window reset signal generation circuit 211 includes: a sixth delayer H6, a seventh AND gate A7 and a seventh delayer H7. The input end of the sixth delayer H6 receives the address flag signal Addr Flag. The first input end of the seventh AND gate A7 is connected to the output end of the sixth delayer H6, and the second input end of the seventh AND gate A7 receives the inner refresh window signal Inner ACT Window. The input end of the seventh delayer H7 is connected to the output end of the seventh AND gate A7. The seventh delayer H7 outputs the refresh window reset signal Refresh Window Reset.

Figure 22:
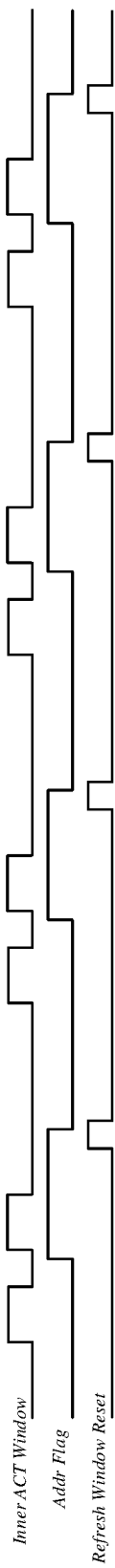
FIG. 22 is schematic signal diagram 10 of a refresh address generation circuit provided by an embodiment of the present disclosure.

In the embodiments of the present disclosure, the sixth delayer H6 may delay the received address flag signal Addr Flag by 0 ns to 2 ns, and the seventh delayer H7 may delay the received signal by 4 ns to 6 ns. In combination with FIG. 21 and FIG. 22, through the sixth delayer H6, the seventh AND gate A7 and the seventh delayer H7, the refresh window reset signal Refresh Window Reset may be obtained by the inner refresh window signal Inner ACT Window and the address flag signal Addr Flag.

Figure 23:
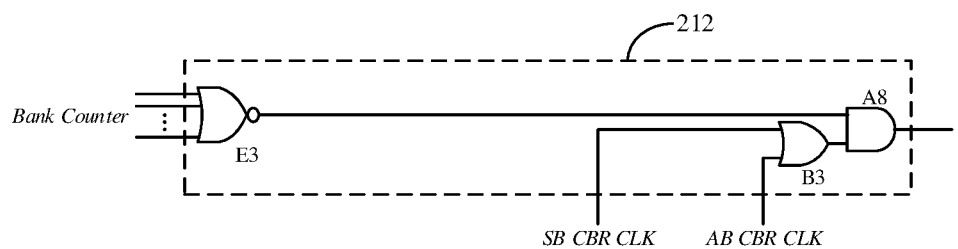
FIG. 23 is schematic structure diagram 13 of a refresh address generation circuit provided by an embodiment of the present disclosure.

In some embodiments of the present disclosure, as shown in FIG. 23, the signal selection circuit 212 includes: a third NOR gate E3, a third OR gate B3 and an eighth AND gate A8. The input ends of the third NOR gate E3 receive the multiple counting signals Bank Counter. The first input end of the third OR gate B3 receives the first clock signal or the second clock signal, that is, the first input end of the third OR gate B3 receives the SameBank refresh clock signal SB CBR CLK, and the second input end of the third OR gate B3 receives the third clock signal AB CBR CLK. The first input end of the eighth AND gate A8 is connected to the output end of the third NOR gate E3, and the second input end of the eighth AND gate A8 is connected to the output end of the third OR gate B3. The eighth AND gate A8 outputs the first clock signal, the second clock signal or the third clock signal AB CBR CLK.

In the embodiments of the present disclosure, in combination with FIG. 4 and FIG. 23, when the first refresh operation is performed, the waveforms of the signals received by the signal selection circuit 212 are shown in FIG. 4, thus the signals output by the third OR gate B3 may include all valid pulses in the SameBank refresh clock signal SB CBR CLK and the third clock signal AB CBR CLK. However, the signal output by the third NOR gate E3 may shield the valid pulse in the third clock signal AB CBR CLK, so the signal output by the eighth AND gate A8 has the same waveform as the SameBank refresh clock signal SB CBR CLK, that is, when the first refresh operation is performed, the eighth AND gate A8 outputs the first clock signal or the second clock signal.

When the second refresh operation is performed, the multiple counting signals Bank Counter<0> to Bank Counter<3> and the SameBank refresh clock signal SB CBR CLK all keep at low level (not shown in FIG. 4), but the waveform of the third clock signal AB CBR CLK is still shown as FIG. 4, so the signal output by the eighth AND gate A8 has the same waveform as the third clock signal AB CBR CLK, that is, when the second refresh operation is performed, the eighth AND gate A8 outputs the third clock signal AB CBR CLK.

Figure 24:
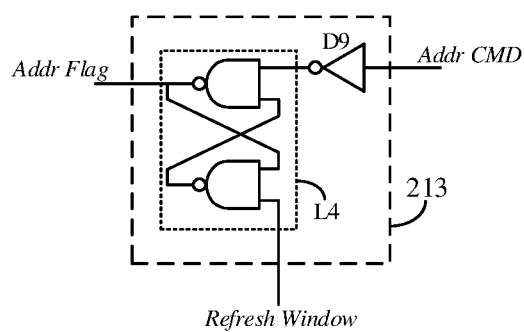
FIG. 24 is schematic structure diagram 14 of a refresh address generation circuit provided by an embodiment of the present disclosure.

In some embodiments of the present disclosure, as shown in FIG. 24, the address flag signal generation circuit 213 includes: a ninth inverter D9 and a fourth latch L4. The input end of the ninth inverter D9 receives the address command signal Addr CMD. The set end of the fourth latch L4 is connected to the output end of the ninth inverter D9, and the reset end of the fourth latch L4 receives the refresh window signal Refresh Window. The fourth latch L4 outputs the address flag signal Addr Flag.

Figure 25:
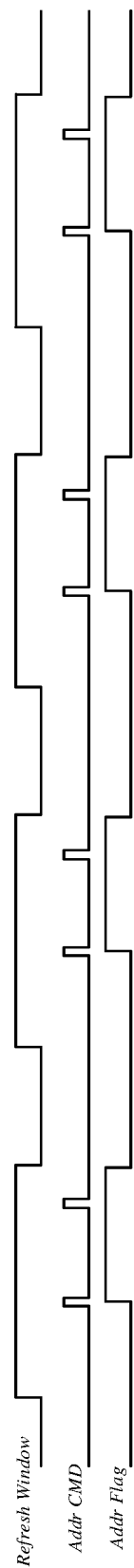
FIG. 25 is schematic signal diagram 11 of a refresh address generation circuit provided by an embodiment of the present disclosure.

In the embodiments of the present disclosure, in combination with FIG. 24 and FIG. 25, the first pulse of the address command signal Addr CMD triggers the address flag signal Addr Flag to jump from low level to high level, the falling edge of the refresh window signal Refresh Window triggers the address flag signal Addr Flag to jump from high level to low level, and then the waveform of the address flag signal Addr Flag as shown in FIG. 25 is obtained.

Figure 26:
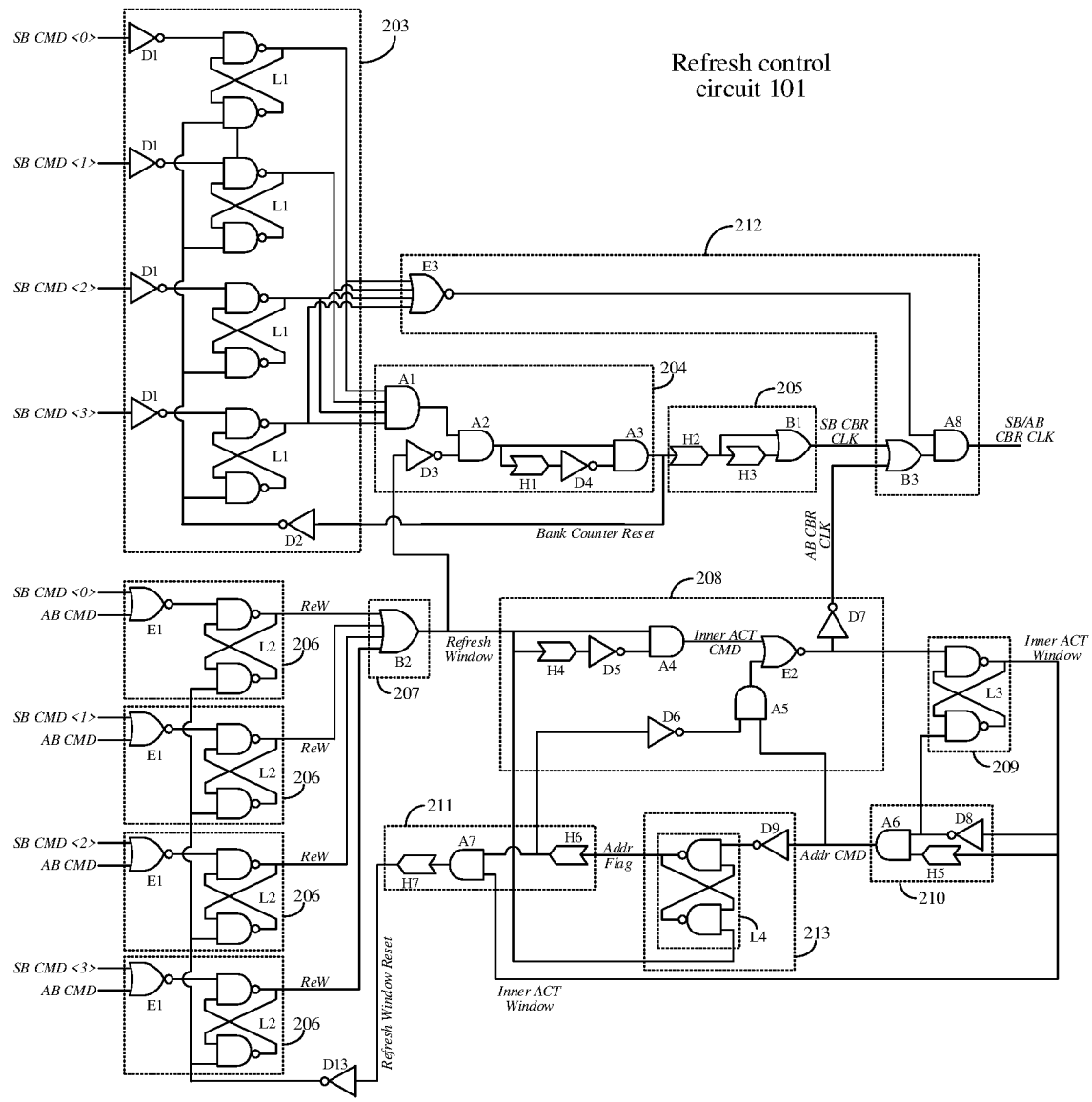
FIG. 26 is schematic structure diagram 15 of a refresh address generation circuit provided by an embodiment of the present disclosure.
Figure 27:
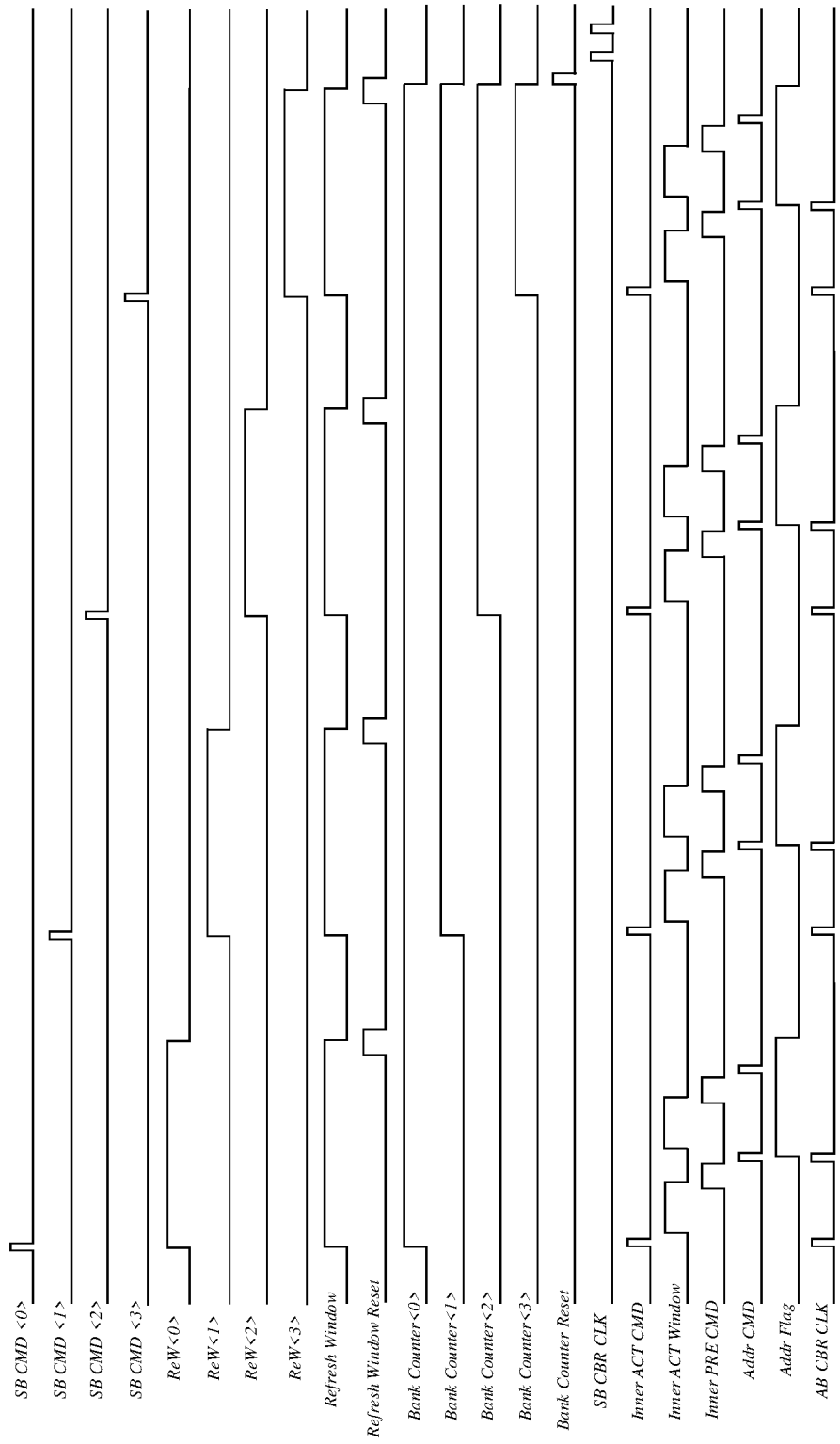
FIG. 27 is schematic signal diagram 12 of a refresh address generation circuit provided by an embodiment of the present disclosure.
Figure 28:
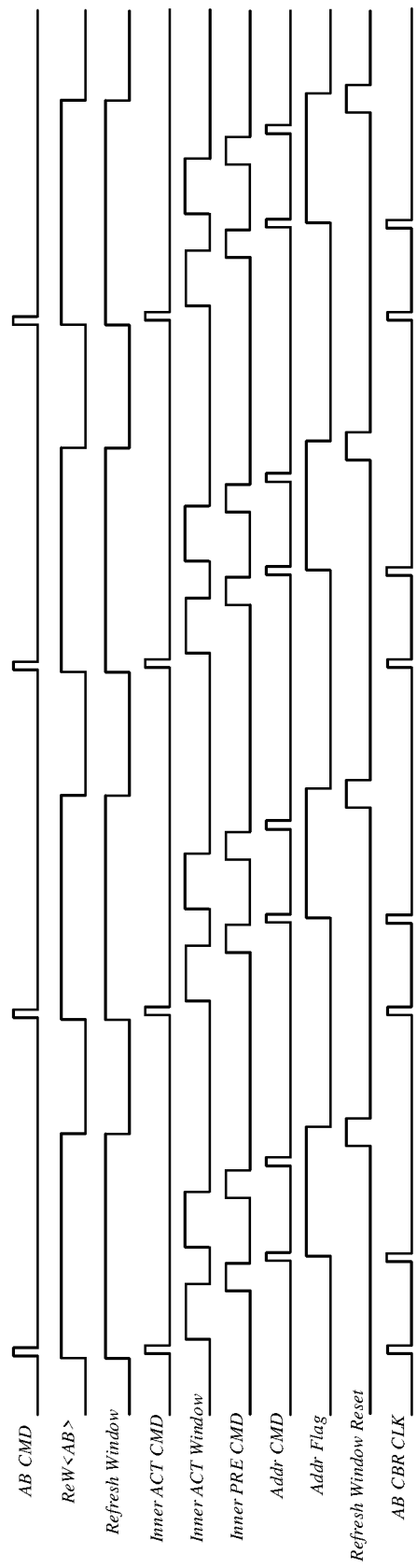
FIG. 28 is schematic signal diagram 13 of a refresh address generation circuit provided by an embodiment of the present disclosure.

FIG. 26 shows an optional implementation of the refresh control circuit 101. FIG. 26 includes the circuit components shown in FIG. 8, FIG. 10, FIG. 11, FIG. 13, FIG. 16, FIG. 17, FIG. 19, FIG. 21, FIG. 23 and FIG. 24. FIG. 27 and FIG. 28 show an optional waveform of some signals in FIG. 26. FIG. 27 is a corresponding signal diagram when the refresh control circuit 101 performs the first refresh operation. FIG. 28 is a corresponding signal diagram when the refresh control circuit 101 performs the second refresh operation.

FIG. 26 takes that the number of banks in the bank group m is 4 as an example, so FIG. 26 includes four first latches L1, four first inverters D1 and four refresh window sub-signal generation circuits 206.

In combination with FIG. 26 and FIG. 27, when the refresh control circuit 101 performs the first refresh operation, the four first refresh commands SB CMD<0>, SB CMD<1>, SB CMD<2> and SB CMD<3> include the valid pulses, while the second refresh command AB CMD (not shown in FIG. 27) includes no valid pulse, that is, the second refresh command AB CMD keeps at low level. Therefore, the set ends of the four first latches L1 receive four first refresh commands SB CMD<0>, SB CMD<1>, SB CMD<2> and SB CMD<3> respectively through four first inverters D1, the four first latches L1 output respectively four counting signals Bank Counter<0>, Bank Counter<1>, Bank Counter<2> and Bank Counter<3> to the input ends of the third NOR gate E3 and the input ends of the first AND gate A1. Furthermore, the signal selection circuit 212 outputs the SameBank refresh clock signal SB CBR CLK (i.e., the first clock signal or the second clock signal) through the eighth AND gate A8. Meanwhile, the set ends of the four second latches L2 receive four first refresh commands SB CMD<0>, SB CMD<1>, SB CMD<2> and SB CMD<3> respectively through first NOR gates E1, and the four second latches L2 output four first refresh window sub-signals ReW<0>, ReW<1>, ReW<2> and ReW<3>, respectively.

In combination with FIG. 7, FIG. 26 and FIG. 27, when the refresh control circuit 101 performs the first refresh operation, the signal selection circuit 212 outputs the Same-Bank refresh clock signal SB CBR CLK (i.e., the first clock signal or the second clock signal) to the address processing circuit 302, the four refresh window sub-signal generation circuits 206 output the four first refresh window sub-signals ReW<0>, ReW<1>, ReW<2> and ReW<3> to the address processing circuit 302, and the address flag signal generation circuit 213 outputs the address flag signal Addr Flag to the address processing circuit 302.

In combination with FIG. 26 and FIG. 28, when the refresh control circuit 101 performs the second refresh operation, the four first refresh commands SB CMD<0>, SB CMD<1>, SB CMD<2> and SB CMD<3> (not shown in FIG. 28) all include no valid pulse, that is, the four first refresh commands SB CMD<0>, SB CMD<1>, SB CMD<2> and SB CMD<3> all keep at low level, while the second refresh command AB CMD includes the valid pulse. Therefore, the four counting signals Bank Counter<0>, Bank Counter<1>, Bank Counter<2> and Bank Counter<3> output by the four first latches L1 all keep at low level (not shown in FIG. 28). Furthermore, the signal selection circuit 212 outputs the third clock signal AB CBR CLK through the eighth AND gate A8. Meanwhile, all the set ends of the four second latches L2 receive the second refresh command AB CMD through the four first NOR gates E1, and all the four second latches L2 output four same second refresh window sub-signals ReW<AB>.

In combination with FIG. 7, FIG. 26 and FIG. 28, when the refresh control circuit 101 performs the second refresh operation, the signal selection circuit 212 outputs the third clock signal AB CBR CLK to the address processing circuit 302, the four refresh window sub-signal generation circuits 206 output four same second refresh window sub-signals ReW<AB> to the address processing circuit 302, and the address flag signal generation circuit 213 outputs the address flag signal Addr Flag to the address processing circuit 302.

Figure 29:
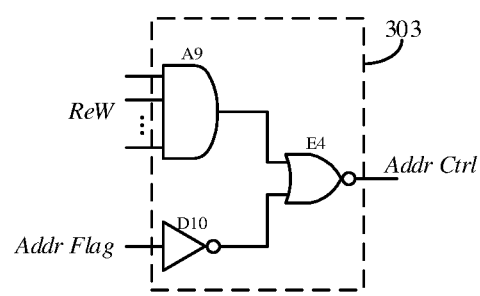
FIG. 29 is schematic structure diagram 16 of a refresh address generation circuit provided by an embodiment of the present disclosure.

In some embodiments of the present disclosure, as shown in FIG. 29, the control signal generation circuit 303 includes: a ninth AND gate A9, a tenth inverter D10 and a fourth NOR gate E4. The input ends of the ninth AND gate A9 receive the multiple refresh window sub-signals ReW respectively. The input end of the tenth inverter D10 receives the address flag signal Addr Flag. The first input end of the fourth NOR gate E4 is connected to the output end of the ninth AND gate A9, and the second input end of the fourth NOR gate E4 is connected to the output end of the tenth inverter D10. The fourth NOR gate E4 outputs the address control signal Addr Ctrl.

Figure 30:
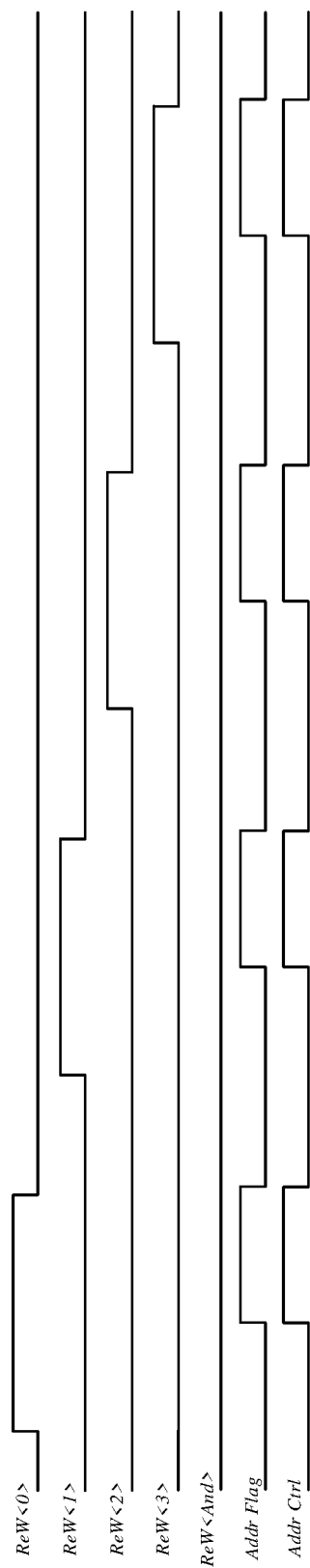
FIG. 30 is schematic signal diagram 14 of a refresh address generation circuit provided by an embodiment of the present disclosure.

In the embodiments of the present disclosure, FIG. 30 takes that m is 4 as an example, in combination with FIG. 29 and FIG. 30, when the refresh control circuit performs the first refresh operation, input ends of the ninth AND gate A9 receive multiple first refresh window sub-signals ReW<0>, ReW<1>, ReW<2> and ReW<3> respectively, and then the signal ReW<And> output by the ninth AND gate A9 is always at low level; in this way, the address control signal Addr Ctrl has the same waveform as the address flag signal Addr Flag, that is, the waveform of the address flag signal Addr Flag remains unchanged after passing through the control signal generation circuit 303.

Figure 31:
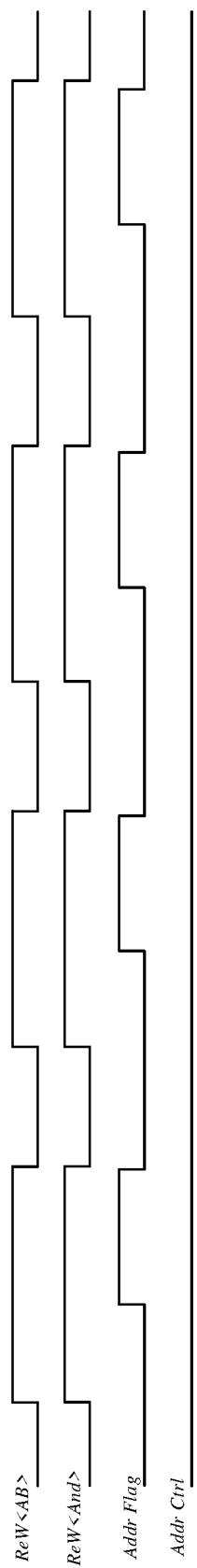
FIG. 31 is schematic signal diagram 15 of a refresh address generation circuit provided by an embodiment of the present disclosure.

In combination with FIG. 29 and FIG. 31, when the refresh control circuit performs the second refresh operation, each input end of the ninth AND gate A9 receives the same second refresh window sub-signal ReW<AB>, and then the signal ReW<And> output by the ninth AND gate A9 has the same waveform as the second refresh window sub-signal ReW<AB>, while the high level area of the signal ReW<And> covers the high level area of the address flag signal Addr Flag. In this way, through the fourth NOR gate E4, the signal ReW<And> may shield the high level area of the address flag signal Addr Flag, so that the address control signal Addr Ctrl is always low level, that is, the address flag signal Addr Flag is shielded after passing through the control signal generation circuit 303.

It is to be noted that the multiple first refresh window sub-signals ReW<0>, ReW<1>, ReW<2> and ReW<3> shown in FIG. 30 have the same waveforms as the multiple first refresh window sub-signals ReW<0>, ReW<1>, ReW<2> and ReW<3> shown in FIG. 14, that is, the multiple first refresh window sub-signals ReW<0>, ReW<1>, ReW<2>, and ReW<3> in FIG. 30 may be obtained according to the example in FIG. 14. The second refresh window sub-signal ReW<AB> shown in FIG. 31 has the same waveform as the second refresh window sub-signal ReW<AB> shown in FIG. 15, that is, the second refresh window sub-signal ReW<AB> in FIG. 31 may be obtained according to the example in FIG. 15.

Figure 32:
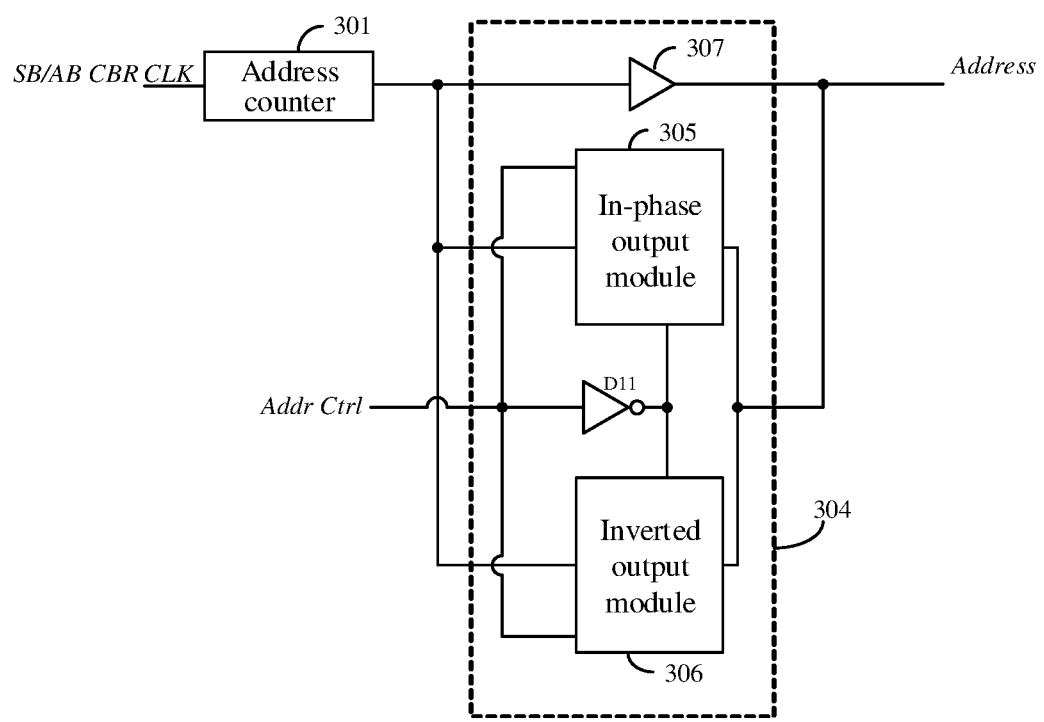
FIG. 32 is schematic structure diagram 17 of a refresh address generation circuit provided by an embodiment of the present disclosure.

In some embodiments of the present disclosure, as shown in FIG. 32, the address selection circuit 304 includes: an in-phase output module 305, an inverted output module 306, an eleventh inverter D11 and an address delay module 307.

The input end of the in-phase output module 305 is connected to the address counter 301. A first control end of the in-phase output module 305 is configured to receive the address control signal Addr Ctrl. A second control end of the in-phase output module 305 is configured to receive the address control signal Addr Ctrl through the eleventh inverter D11. The in-phase output module 305 is configured to obtain and output the lowest bit of the first address in response to the address control signal Addr Ctrl when the refresh control circuit receives the first refresh command and the address flag signal Addr Flag is a first value.

The input end of the inverted output module 306 is connected to the address counter 301. A first control end of the inverted output module 306 is configured to receive the address control signal Addr Ctrl through the eleventh inverter D11. A second control end of the inverted output module 306 is configured to receive the address control signal Addr Ctrl. The inverted output module 306 is configured to obtain and invert the lowest bit of the first address, and output the inverted lowest bit of the first address in response to the address control signal Addr Ctrl when the refresh control circuit receives the first refresh command and the address flag signal Addr Flag is a second value.

The address delay module 307 is connected to the address counter 301, and is configured to obtain other bits of the first address, and delay and output the other bits of the first address when the refresh control circuit receives the first refresh command. The other bits are address bits except the lowest bit.

In the embodiments of the present disclosure, the first address received by the address selection circuit 304 from the address counter 301 is transmitted in two parts, that is, the lowest bit of the first address is transmitted to the in-phase output module 305 and the inverted output module 306, and the other bits except the lowest bit of the first address are transmitted to the address delay module 307. Both the in-phase output module 305 and the inverted output module 306 receive the address control signal Addr Ctrl. The in-phase output module 305 outputs the lowest bit of the first address under the control of the address control signal Addr Ctrl, while the inverted output module 306 inverts the lowest bit of the first address and outputs the inverted lowest bit of the first address under the control of the address control signal Addr Ctrl. Since the lowest bit of the first address will be delayed in the timing sequence after passing through the in-phase output module 305 or the inverted output module 306, the other bits of the first address need to pass through the address delay module 307 to match the timing sequence.

It is to be noted that the number of address bits of the first address may be set according to actual needs, for example, if the first address Address<15:0> is a 16-bit address, then the lowest bit of the first address Address<15:0> is the 15th-bit address Address<15>, and the address bits except the lowest bit in the first address Address<15:0> are the 0th-bit to the 14th-bit address Address<14:0>, which is not limited in the present disclosure.

Figure 33:
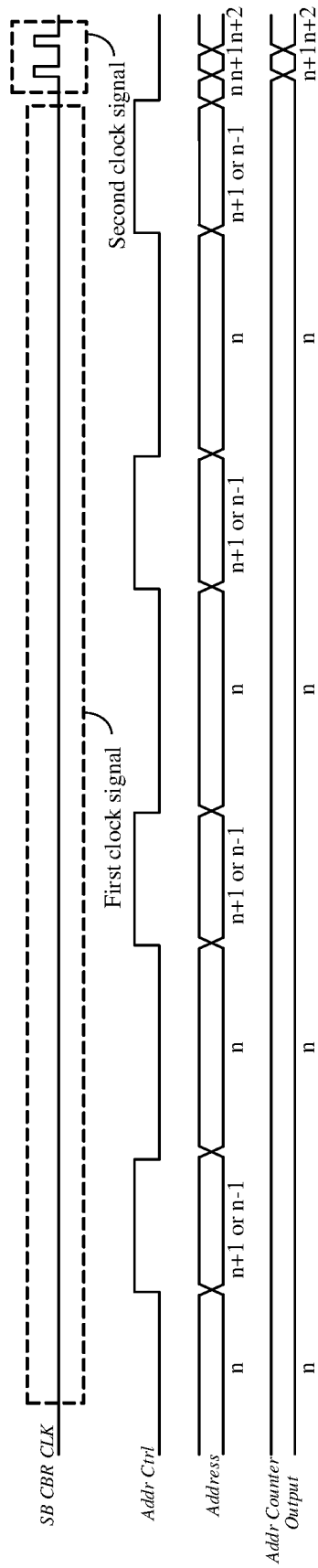
FIG. 33 is schematic signal diagram 16 of a refresh address generation circuit provided by an embodiment of the present disclosure.

In the embodiments of the present disclosure, referring to FIG. 32 and FIG. 33, when the refresh control circuit receives the first refresh command, the address counter 301 receives the SameBank refresh clock signal SB CBR CLK, namely the first clock signal or the second clock signal.

When the address counter 301 receives the first clock signal, because the first clock signal includes no valid pulse, the address counter 301 will not be triggered to change the first address. The address output signal Addr Counter Output represents the first address stored by the address counter 301. Referring to FIG. 33, when the address counter 301 receives the first clock signal, the first address remains n; while the addresses to be refreshed Address output by the address selection circuit 304 output alternately n and n+1, or n and n−1 under the control of the address control signal Addr Ctrl. Here, n+1 or n−1 is the second address, and the lowest bit of the second address is opposite to the lowest bit of the first address n. When the lowest bit of the first address n is 0, the second address is n+1. When the lowest bit of the first address n is 1, the second address is n−1. Each group of n and n+1, or n and n−1, output by the addresses to be refreshed is used for the corresponding SameBank in the bank group to perform the first refresh operation, until the first refresh operations are completed for all banks in the bank group, that is, the number of first refresh operations reaches m (taking that m is 4 as an example in FIG. 33), and the first address stored by the address counter 301 remains n in this process.

When the number of first refresh operations reaches m, that is, after the first refresh operations of this round are completed for all banks, the address counter 301 receives the second clock signal. Since the second clock signal includes two valid pulses, the address counter 301 adds 2 to the first address, that is, changes the first address to the third address. In this case, the first refresh operations of the last round have been completed for all banks in the bank group, and after receiving the first refresh commands of the next round, the refresh control circuit may perform the first refresh operations of the next round according to the third address.

For example, the current first address is 0000, the lowest bit of the first address is inverted, and then the first address is changed to the second address 0001; the second address is obtained by adding 1 to the first address. In this way, the first refresh operation (Same Bank Refresh) is performed to each bank. After the first refresh operations of this round are completed for all banks, triggered by two pulses in the second clock signal, the address generator 102 adds 2 to the first address, outputs 0010, and then the first refresh operations of the next round are performed. For another example, the current first address is 0001, the lowest bit of the first address is inverted, and then the first address is changed to the second address 0000; the second address is obtained by subtracting 1 from the first address. After the first refresh operations of this round are completed for all banks, triggered by two pulses in the second clock signal, the address generator 102 adds 2 to the first address, outputs 0011, and then the first refresh operations of the next round are performed.

It is to be noted that the waveforms of the first clock signal or the second clock signal shown in FIG. 33 and FIG. 2 are the same, that is, the first clock signal or the second clock signal shown in FIG. 33 may be obtained by the example in FIG. 2.

It is to be understood that when the first refresh operation is performed to the SameBank in the band group, the first refresh operations are performed for two adjacent addresses (i.e., n and n+1, or n and n−1) in the SameBank, and the first address n remains unchanged in this process. After the first refresh operations performed for two adjacent addresses are completed for all banks in the bank group, that is, after the first refresh operations of the last round are completed for all banks in the bank group, the first address is added with 2 to become the third address, and the first refresh operations of the next round may be performed according to the third address. In this way, the first refresh operations may be performed for the addresses in all banks according to the order of address, thus ensuring the continuity of the refreshed addresses and avoiding not performing the first refresh operations due to omission of the address.

In the embodiments of the present disclosure, referring to FIG. 32, the in-phase output module 305 is further configured to obtain and output the lowest bit of the fourth address or the lowest bit of the fifth address in response to the address control signal Addr Ctrl when the refresh control circuit receives the second refresh command.

The address delay module 307 is further configured to obtain other bits of the fourth address or other bits of the fifth address, and delay and output the other bits of the fourth address or the other bits of the fifth address when the refresh control circuit receives the second refresh command.

In the embodiments of the present disclosure, the fourth address or the fifth address received by the address selection circuit 304 from the address counter 301 is transmitted in two parts, that is, the lowest bit of the address is transmitted to the in-phase output module 305 and the inverted output module 306, and the other bits except the lowest bit of the address are transmitted to the address delay module 307. Both the in-phase output module 305 and the inverted output module 306 receive the address control signal Addr Ctrl. The in-phase output module 305 outputs the lowest bit of the address under the control of the address control signal Addr Ctrl, while the inverted output module 306 inverts the lowest bit of the address and outputs the inverted lowest bit of the address under the control of the address control signal Addr Ctrl. Since the lowest bit of the address will be delayed in the timing sequence after passing through the in-phase output module 305 or the inverted output module 306, the other bits of the address need to pass through the address delay module 307 to match the timing sequence.

Figure 34:
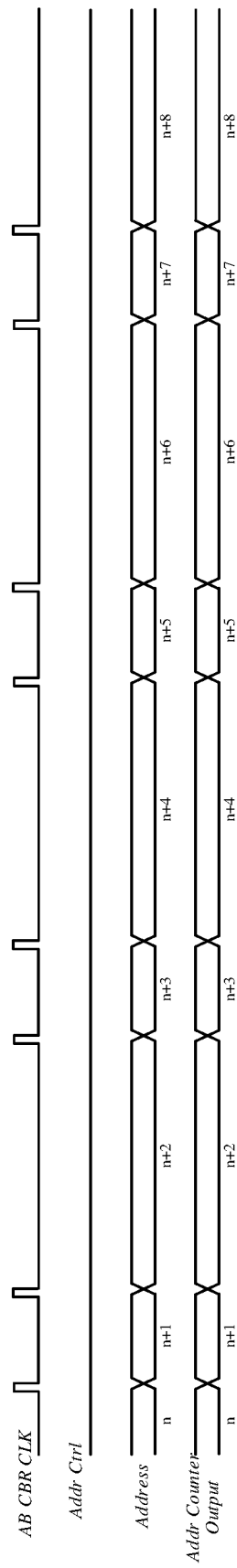
FIG. 34 is schematic signal diagram 17 of a refresh address generation circuit provided by an embodiment of the present disclosure.

Referring to FIG. 32 and FIG. 34, when the refresh control circuit receives the second refresh command, the address counter 301 receives the third clock signal AB CBR CLK. Each valid pulse in the third clock signal AB CBR CLK triggers the address counter 301 to add 1 to the first address. The address output signal Addr Counter Output represents the first address stored by the address counter 301. Referring to FIG. 34, the address output signal Addr Counter Output is accumulated under the trigger of the third clock signal AB CBR CLK. The third clock signal AB CBR CLK shown in FIG. 34 includes four cycles, and every two valid pulses are a cycle, thus, in the first cycle, the first address n is triggered to change to the fifth address n+2; in the second period, n+2 as the first address is triggered to change to the fifth address n+4, and so on.

Meanwhile, the address control signal Addr Ctrl keeps at low level, thus the inverted output module 306 does not work, and the lowest bit of the address is output through the in-phase output module 305; that is, the addresses to be refreshed for the second refresh operation keep consistent with the address output signal Addr Counter Output. In this way, the second refresh operation may be performed for the addresses in all banks according to the order of address, thus avoiding not performing the second refresh operations due to omission of the address.

It is to be noted that the waveforms of the third clock signal AB CBR CLK shown in FIG. 34 and FIG. 5 are the same, that is, the third clock signal AB CBR CLK shown in FIG. 34 may be obtained by the example in FIG. 5.

It is to be understood that when the second refresh operation is performed to all banks in the bank group, the address generator 102 generates the continuous addresses to be refreshed according to the third clock signal AB CBR CLK, so that the second refresh operation (i.e., All Bank Refresh) is performed for the addresses in all banks in sequence. In this way, the second refresh operation may be performed to the addresses in all banks according to the order of address, thus ensuring the continuity of the refreshed addresses and avoiding not performing the second refresh operations due to omission of the address. Meanwhile, two types of refresh operations may be performed flexibly by one address generator 102, which improves the compatibility of the circuit.

Figure 35:
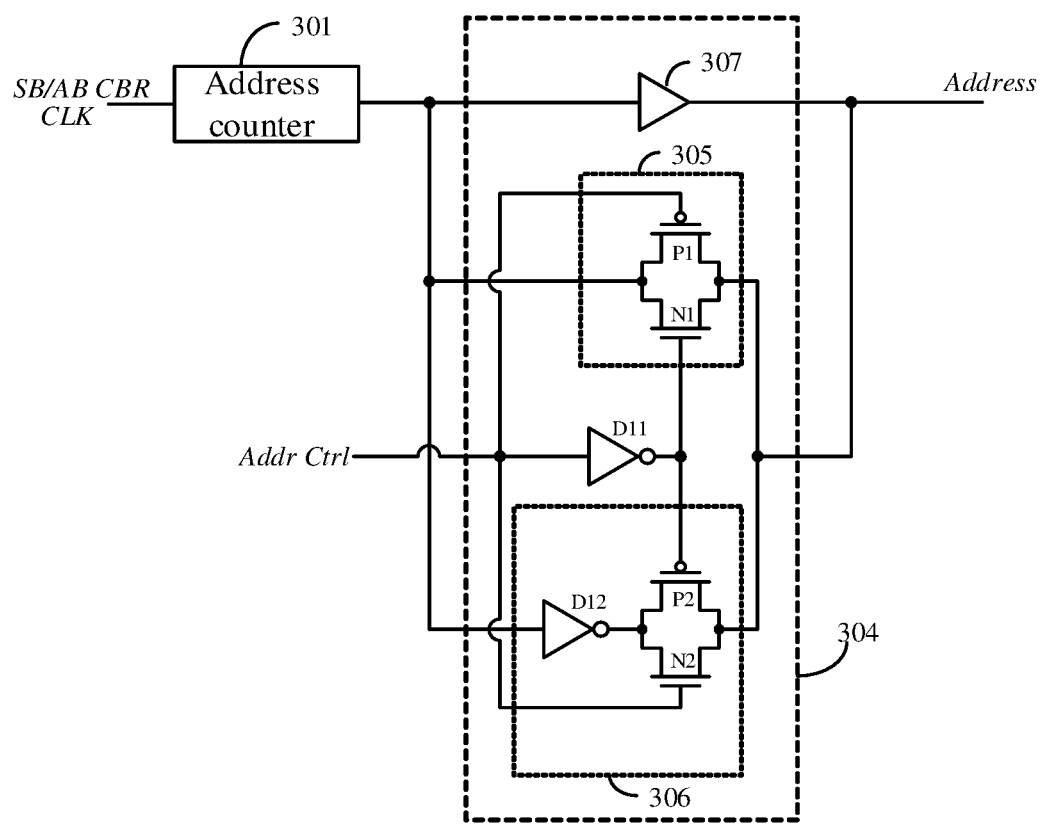
FIG. 35 is schematic structure diagram 18 of a refresh address generation circuit provided by an embodiment of the present disclosure.

In some embodiments of the present disclosure, as shown in FIG. 35, the in-phase output module 305 includes: a first PMOS transistor P1 and a first NMOS transistor N1. The inverted output module 306 includes: a twelfth inverter D12, a second PMOS transistor P2, and a second NMOS transistor N2.

The gate of the first PMOS transistor P1 serves as the first control end of the in-phase output module 305, the gate of the first NMOS transistor N1 serves as the second control end of the in-phase output module 305, the source of the first PMOS transistor P1 is connected to the drain of the first NMOS transistor N1 and serves as the input end of the in-phase output module 305, and the drain of the first PMOS transistor P1 is connected to the source of the first NMOS transistor N1 and serves as the output end of the in-phase output module 305. The gate of the second PMOS transistor P2 serves as the first control end of the inverted output module 306, the gate of the second NMOS transistor N2 serves as the second control end of the inverted output module 306, the input end of the twelfth inverter D12 serves as the input end of the inverted output module 306, the output end of the twelfth inverter D12 is connected to the source of the second PMOS transistor P2 and the drain of the second NMOS transistor N2, and the drain of the second PMOS transistor P2 is connected to the source of the second NMOS transistor N2 and serves as the output end of the inverted output module 306.

In the embodiments of the present disclosure, the source of the first PMOS transistor P1 is connected to the drain of the first NMOS transistor N1, and serves as the input end of the in-phase output module 305 to receive the lowest bit of the address from the address counter 301. If the address control signal Addr Ctrl is at low level, the first PMOS transistor P1 and the first NMOS transistor N1 are on, and the lowest bit of the address is output by the drain of the first PMOS transistor P1 and the source of the first NMOS transistor N1. If the address control signal Addr Ctrl is at high level, the first PMOS transistor P1 and the first NMOS transistor N1 are off, and there is no output signal at the drain of the first PMOS transistor P1 and the source of the first NMOS transistor N1.

The input end of the twelfth inverter D12 serves as the input end of the inverted output module 306 and receives the lowest bit of the address from the address counter 301. The lowest bit of the address is inverted after passing through the twelfth inverter D12. If the address control signal Addr Ctrl is at high level, the second PMOS transistor P2 and the second NMOS transistor N2 are on, and the inverted lowest bit of the address is output by the drain of the second PMOS transistor P2 and the source of the second NMOS transistor N2. If the address control signal Addr Ctrl is at low level, the second PMOS transistor P2 and the second NMOS transistor N2 are off, and there is no output signal at the drain of the second PMOS transistor P2 and the source of the second NMOS transistor N2.

It is to be noted that the in-phase output module 305 may also be configured to output the lowest bit of the address when the address control signal Addr Ctrl is at high level, and the inverted output module 306 may also be configured to invert the lowest bit of the address and output the inverted lowest bit of the address when the address control signal Addr Ctrl is at low level, which is not limited here.

It should be noted that in the present disclosure, terms "include" and "contain" or any other variation thereof are intended to cover nonexclusive inclusions, so that a process, method, object or device including a series of elements not only includes those elements but also includes other elements which are not clearly listed or further includes elements intrinsic to the process, the method, the object or the device. Under the condition of no more limitations, an element defined by the statement "including a/an" does not exclude existence of the same other elements in a process, method, object or device including the element.

The above is only the specific implementation of the disclosure and not intended to limit the scope of protection of the disclosure. Any variations or replacements apparent to those skilled in the art within the technical scope disclosed by the disclosure shall fall within the scope of protection of the disclosure. Therefore, the scope of protection of the disclosure shall be subject to the scope of protection of the claims.

The embodiments of the present disclosure provide a refresh address generation circuit, which includes: a refresh control circuit and an address generator. The refresh control circuit receives multiple first refresh commands in sequence and performs multiple first refresh operations accordingly, outputs a first clock signal when the number of the first refresh operations is less than m, and outputs a second clock signal when the number of the first refresh operation is equal to m. m is an integer greater than or equal to 1. The address generator is coupled to the refresh control circuit, and is configured to prestore a first address and receive the first clock signal or the second clock signal, and during each first refresh operation, output an address to be refreshed in response to the first clock signal and change the first address in response to the second clock signal. The address to be refreshed includes a first address and a second address. The lowest bit of the second address is opposite to the lowest bit of the first address. Thus, during the first refresh operation, the address generator not only outputs the address to be refreshed including the first address and the second address, but also maintains the first address unchanged in response to the first clock signal; and after the number of first refresh operations is equal to m, the address generator changes the first address again in response to the second clock signal. In this way, it is ensured that the refresh operations are without omission, and the integrity of the address is maintained.

What is claimed is:

1. A refresh address generation circuit, comprising:
   a refresh control circuit, configured to receive multiple first refresh commands in sequence and perform multiple first refresh operations correspondingly, output a first clock signal when a number of the first refresh operations is less than m, and output a second clock signal when the number of the first refresh operations is equal to m, m being an integer greater than or equal to 1; and
   an address generator, coupled to the refresh control circuit and configured to prestore a first address and receive the first clock signal or the second clock signal, and during each first refresh operation, output an address to be refreshed in response to the first clock signal and change the first address in response to the second clock signal, wherein the address to be refreshed comprises the first address and a second address, and a lowest bit of the second address is opposite to a lowest bit of the first address.

2. The circuit of claim 1, wherein the refresh control circuit comprises:
   a refresh window signal generation circuit, configured to receive the multiple first refresh commands and a refresh window reset signal, and generate a refresh window signal according to the multiple first refresh commands and the refresh window reset signal, wherein a duration of a pulse of the refresh window signal is a window time during which the refresh control circuit performs a refresh operation, and the refresh window reset signal is used to reset the refresh window signal generation circuit after a refresh operation is finished; and
   a clock pulse generation circuit, coupled to the refresh window signal generation circuit and configured to receive the refresh window signal and the first refresh commands, and generate the first clock signal when a number of the first refresh commands received by the clock pulse generation circuit is less than or equal to m and before an m-th first refresh operation is finished, or generate the second clock signal after the m-th first refresh operation is finished.

3. The circuit of claim 2, wherein the clock pulse generation circuit comprises:
   a counting circuit, configured to receive the first refresh commands and a counting reset signal, count the first refresh commands and output counting signals, and reset according to the counting reset signal;
   a counting reset signal generation circuit, coupled to the counting circuit and the refresh window signal generation circuit, and configured to generate the counting reset signal after the m-th first refresh operation is finished; and
   a first pulse generation subcircuit, coupled to the counting reset signal generation circuit and configured to generate the first clock signal according to the counting signals when the number of first refresh commands is less than m, or generate the second clock signal according to the counting reset signal when the number of first refresh commands is equal to m.

4. The circuit of claim 2, wherein the refresh window signal generation circuit comprises:
multiple refresh window sub-signal generation circuits, configured to receive the refresh window reset signal and correspondingly receive the multiple first refresh commands in sequence, and output multiple refresh window sub-signals in sequence according to the multiple first refresh commands and the refresh window reset signal; and
a refresh window sub-signal processing circuit, coupled to the multiple refresh window sub-signal generation circuits and configured to receive the multiple refresh window sub-signals in sequence, perform a logical operation on the refresh window sub-signals, and output the refresh window signal.

5. The circuit of claim 4, wherein the refresh control circuit is further configured to receive a second refresh command and perform a second refresh operation; wherein,
the multiple refresh window sub-signal generation circuits are further configured to receive the second refresh command and the refresh window reset signal simultaneously, and generate same multiple refresh window sub-signals according to the second refresh command and the refresh window reset signal in one-to-one correspondence;
the refresh window sub-signal processing circuit is further configured to receive the multiple refresh window sub-signals, perform the logical operation to the refresh window sub-signals, and output the refresh window signal.

6. The circuit of claim 3, wherein the refresh control circuit further comprises:
a second pulse generation subcircuit, coupled to the refresh window signal generation circuit, and configured to receive the refresh window signal and an address command signal, generate a first pulse of a third clock signal when the refresh control circuit starts to perform a first refresh operation or a second refresh operation, and output a second pulse of the third clock signal according to a first pulse of the address command signal, to output the third clock signal;
an inner refresh window signal generation circuit, configured to receive the third clock signal and generate an inner refresh window signal according to the third clock signal, wherein a first pulse of the inner refresh window signal is generated after the first pulse of the third clock signal and ended before the second pulse of the third clock signal is generated, and a second pulse of the inner refresh window signal is generated after the second pulse of the third clock signal and ended before the pulse of the refresh window signal is ended;
an address command signal generation circuit, configured to generate the first pulse and a second pulse of the address command signal according to a falling edge of the inner refresh window signal, wherein the first pulse of the address command signal is used to generate the second pulse of the inner refresh window signal and the second pulse of the third clock signal; and
a refresh window reset signal generation circuit, configured to receive the inner refresh window signal and generate a pulse of the refresh window reset signal according to a falling edge of the second pulse of the inner refresh window signal.

7. The circuit of claim 6, wherein the refresh control circuit further comprises:
a signal selection circuit, coupled to the counting circuit, the first pulse generation subcircuit and the second pulse generation subcircuit, and configured to receive the counting signals, the first clock signal, the second clock signal, and the third clock signal, output the first clock signal or the second clock signal according to the counting signals when the refresh control circuit performs the first refresh operation, or output the third clock signal according to the counting signals when the refresh control circuit performs the second refresh operation.

8. The circuit of claim 7, wherein the refresh control circuit further comprises:
an address flag signal generation circuit, coupled to the address command signal generation circuit and the refresh window signal generation circuit, and configured to receive the address command signal and the refresh window signal, generate a rising edge of an address flag signal according to a first rising edge of the address command signal, and generate a falling edge of the address flag signal according to a falling edge of the refresh window signal.

9. The circuit of claim 8, wherein the address generator comprises:
an address counter, coupled to the signal selection circuit and configured to prestore the first address, change the first address to a third address according to the second clock signal, or change the first address and output a fourth address and a fifth address according to the third clock signal, wherein the first address, the fourth address and the fifth address are three consecutive addresses in sequence; and
an address processing circuit, coupled to the address counter and the refresh window sub-signal generation circuits, and configured to receive the address flag signal when the refresh control circuit performs the first refresh operation, obtain the first address, and output the first address before a rising edge of the address flag signal, or output the second address after the rising edge of the address flag signal;
wherein the address processing circuit is further configured to obtain the fourth address and the fifth address in sequence when the refresh control circuit performs the second refresh operation, and output the fourth address and the fifth address in sequence according to the multiple refresh window sub-signals.

10. The circuit of claim 9, wherein the address processing circuit comprises:
a control signal generation circuit, coupled to the refresh window sub-signal generation circuits and the address flag signal generation circuit, and configured to receive the multiple refresh window sub-signals and the address flag signal, and generate an address control signal according to the multiple refresh window sub-signals and the address flag signal; and
an address selection circuit, coupled to the address counter and the control signal generation circuit, and configured to output the first address according to the address control signal when the refresh control circuit receives the first refresh command, or invert the first address according to the address control signal to obtain and output the second address;
wherein the address selection circuit is further configured to output the fourth address and the fifth address sequentially in response to the address control signal when the refresh control circuit receives the second refresh command.

11. The circuit of claim 5, wherein the refresh window sub-signals comprise: first refresh window sub-signals or second refresh window sub-signals, and each refresh window sub-signal generation circuit comprises: a first NOR gate, and a second latch; wherein when the refresh control circuit performs the first refresh operation, a first input end of the first NOR gate receives a corresponding first refresh command, or when the refresh control circuit performs the second refresh operation, a second input end of the first NOR gate receives the second refresh command; and a set end of the second latch is connected to an output end of the first NOR gate, and a reset end of the second latch receives the refresh window reset signal, when the refresh control circuit performs the first refresh operation, the second latch outputs a corresponding first refresh window sub-signal, or when the refresh control circuit performs the second refresh operation, the second latch outputs a corresponding second refresh window sub-signal; and wherein the refresh window sub-signal processing circuit comprises: a second OR gate, wherein when the refresh control circuit performs the first refresh operation, input ends of the second OR gate receive the multiple first refresh window sub-signals respectively, or when the refresh control circuit performs the second refresh operation, the input ends of the second OR gate receives the same multiple second refresh window sub-signals respectively, and the second OR gate outputs the refresh window signal.

12. The circuit of claim 6, wherein the second pulse generation subcircuit comprises: a fourth delayer, a fifth inverter, a fourth AND gate, a sixth inverter, a fifth AND gate, a second NOR gate, and a seventh inverter; wherein an input end of the fourth delayer receives the refresh window signal;

an input end of the fifth inverter is connected to an output end of the fourth delayer;

a first input end of the fourth AND gate receives the refresh window signal, and a second input end of the fourth AND gate is connected to an output end of the fifth inverter;

an input end of the sixth inverter receives an address flag signal;

a first input end of the fifth AND gate is connected to an output end of the sixth inverter, and a second input end of the fifth AND gate receives the address command signal;

input ends of the second NOR gate are connected to an output end of the fourth AND gate and an output end of the fifth AND gate respectively; and an input end of the seventh inverter is connected to an output end of the second NOR gate, and the seventh inverter outputs the third clock signal.

13. The circuit of claim 6, wherein the address command signal generation circuit comprises: an eighth inverter, a fifth delayer, and a sixth AND gate; wherein an input end of the eighth inverter receives the inner refresh window signal;

an input end of the fifth delayer is connected to the input end of the eighth inverter to receive the inner refresh window signal; and input ends of the sixth AND gate are connected to an output end of the eighth inverter and an output end of the fifth delayer respectively, and the sixth AND gate outputs the address command signal; and wherein the inner refresh window signal generation circuit comprises: a third latch, wherein a set end of the third latch receives the third clock signal, and a reset end of the third latch is connected to the output end of the eighth inverter, and the third latch outputs the inner refresh window signal.

14. The circuit of claim 6, wherein the refresh window reset signal generation circuit comprises: a sixth delayer, a seventh AND gate, and a seventh delayer; wherein an input end of the sixth delayer receives an address flag signal;

a first input end of the seventh AND gate is connected to an output end of the sixth delayer, and a second input end of the seventh AND gate receives the inner refresh window signal; and an input end of the seventh delayer is connected to an output end of the seventh AND gate, and the seventh delayer outputs the refresh window reset signal.

15. The circuit of claim 7, wherein the signal selection circuit comprises: a third NOR gate, a third OR gate, and an eighth AND gate; wherein input ends of the third NOR gate receive the multiple counting signals;

a first input end of the third OR gate receives the first clock signal or the second clock signal, and a second input end of the third OR gate receives the third clock signal; and a first input end of the eighth AND gate is connected to an output end of the third NOR gate, and a second input end is connected to an output end of the third OR gate, and the eighth AND gate outputs the first clock signal, the second clock signal or the third clock signal.

16. The circuit of claim 8, wherein the address flag signal generation circuit comprises:

a ninth inverter, an input end of the ninth inverter receiving the address command signal; and a fourth latch, a set end of the fourth latch being connected to an output end of the ninth inverter, and a reset end of the fourth latch receiving the refresh window signal, wherein the fourth latch outputs the address flag signal.

17. The circuit of claim 10, wherein the control signal generation circuit comprises: a ninth AND gate, a tenth inverter, and a fourth NOR gate; wherein input ends of the ninth AND gate receive the multiple refresh window sub-signals respectively;

an input end of the tenth inverter receives the address flag signal; and a first input end of the fourth NOR gate is connected to an output end of the ninth AND gate, and a second input end of the fourth NOR gate is connected to an output end of the tenth inverter, and the fourth NOR gate outputs the address control signal.

18. The circuit of claim 10, wherein the address selection circuit comprises: an in-phase output module, an inverted output module, an eleventh inverter and an address delay module;

an input end of the in-phase output module is connected to the address counter, a first control end of the in-phase output module is configured to receive the address control signal, a second control end of the in-phase output module is configured to receive the address control signal through the eleventh inverter, and the in-phase output module is configured to obtain and output the lowest bit of the first address in response to the address control signal when the refresh control circuit receives the first refresh command and the address flag signal is a first value;

an input end of the inverted output module is connected to the address counter, a first control end of the inverted output module is configured to receive the address control signal through the eleventh inverter, a second control end of the inverted output module is configured to receive the address control signal, and the inverted output module is configured to, in response to the address control signal when the refresh control circuit receives the first refresh command and the address flag signal is a second value, obtain and invert the lowest bit of the first address, and output the inverted lowest bit of the first address; and the address delay module is connected to the address counter, and is configured to obtain other bits of the first address, and delay and output the other bits of the first address when the refresh control circuit receives the first refresh command, the other bits being address bits except the lowest bit.

19. The circuit of claim 18, wherein, the in-phase output module is further configured to obtain and output a lowest bit of the fourth address or a lowest bit of the fifth address in response to the address control signal when the refresh control circuit receives the second refresh command; and the address delay module is further configured to obtain other bits of the fourth address or other bits of the fifth address, and delay and output the other bits of the fourth address or the other bits of the fifth address when the refresh control circuit receives the second refresh command.

20. The circuit of claim 18, wherein the in-phase output module comprises: a first PMOS transistor and a first NMOS transistor, and the inverted output module comprises: a twelfth inverter, a second PMOS transistor, and a second NMOS transistor; wherein a gate of the first PMOS transistor serves as the first control end of the in-phase output module, a gate of the first NMOS transistor serves as the second control end of the in-phase output module, a source of the first PMOS transistor is connected to a drain of the first NMOS transistor and serves as the input end of the in-phase output module, and a drain of the first PMOS transistor is connected to a source of the first NMOS transistor and serves as an output end of the in-phase output module;

a gate of the second PMOS transistor serves as the first control end of the inverted output module, a gate of the second NMOS transistor serves as the second control end of the inverted output module, an input end of the twelfth inverter serves as the input end of the inverted output module, an output end of the twelfth inverter is connected to a source of the second PMOS transistor and a drain of the second NMOS transistor, and a drain of the second PMOS transistor is connected to a source of the second NMOS transistor and serves as an output end of the inverted output module.

* * * * *